(12) United States Patent
Kamiyama

(10) Patent No.: US 7,224,363 B2
(45) Date of Patent: May 29, 2007

(54) COMPUTER-READABLE RECORDING MEDIUM WITH WAVEFORM EDITING PROGRAM STORED AND WAVEFORM EDITING SYSTEM

(75) Inventor: Naoya Kamiyama, Kobe (JP)

(73) Assignee: Fujitsu Ten Limited, Hyogo (JP)

( * ) Notice: Subject to any disclaimer, the term of this patent is extended or adjusted under 35 U.S.C. 154(b) by 278 days.

(21) Appl. No.: 10/712,347

(22) Filed: Nov. 14, 2003

(65) Prior Publication Data

US 2004/0095350 A1    May 20, 2004

(30) Foreign Application Priority Data

Nov. 15, 2002    (JP)    ............... 2002-331630

(51) Int. Cl.
    *G06T 15/00*    (2006.01)
(52) U.S. Cl. .................... 345/440; 702/67; 702/68
(58) Field of Classification Search ............... 345/440, 345/619; 702/67, 68
    See application file for complete search history.

(56) References Cited

U.S. PATENT DOCUMENTS

| | | | |
|---|---|---|---|
| 4,754,205 A | | 6/1988 | Diller et al. ................. 345/440 |
| 6,781,584 B2 * | | 8/2004 | Shen et al. ............... 345/440.1 |
| 6,952,655 B2 * | | 10/2005 | Cake et al. .................... 702/67 |
| 7,010,442 B2 * | | 3/2006 | Fender .......................... 702/68 |
| 2002/0075267 A1 * | | 6/2002 | Cake et al. ................. 345/440 |

FOREIGN PATENT DOCUMENTS

| | | |
|---|---|---|
| JP | 5-133981 | 5/1993 |
| JP | 6-44013 | 6/1994 |
| JP | 06-231195 | 8/1994 |
| JP | 7-294558 | 11/1995 |
| JP | 7-294616 | 11/1995 |
| JP | 08-068669 | 3/1996 |
| JP | 08-293771 | 11/1996 |
| JP | 08-313559 | 11/1996 |
| JP | 09-198223 | 7/1997 |
| JP | 10-148546 | 5/1998 |
| JP | 10-300793 | 11/1998 |
| JP | 11-167413 | 6/1999 |
| JP | 2001-051760 | 2/2001 |

* cited by examiner

*Primary Examiner*—Phu K. Nguyen
(74) *Attorney, Agent, or Firm*—Wenderoth, Lind & Ponack, L.L.P.

(57) ABSTRACT

A waveform editing program displays waveforms of different types generated from the same data on the same screen, so that the characteristics of the waveforms can be easy to know, and with improved operability in the waveform editing, desired waveforms can be easily generated. A waveform editing system has at least a display device to display waveforms on a screen and an input device enabling input operations. The waveform editing system can display a waveform generated based on data input through the input device or data captured from an outside source on the screen, and is allowed to implement a first waveform display function of superimposing and displaying an analog waveform based on prescribed data and binary waveforms based on the prescribed data.

10 Claims, 26 Drawing Sheets

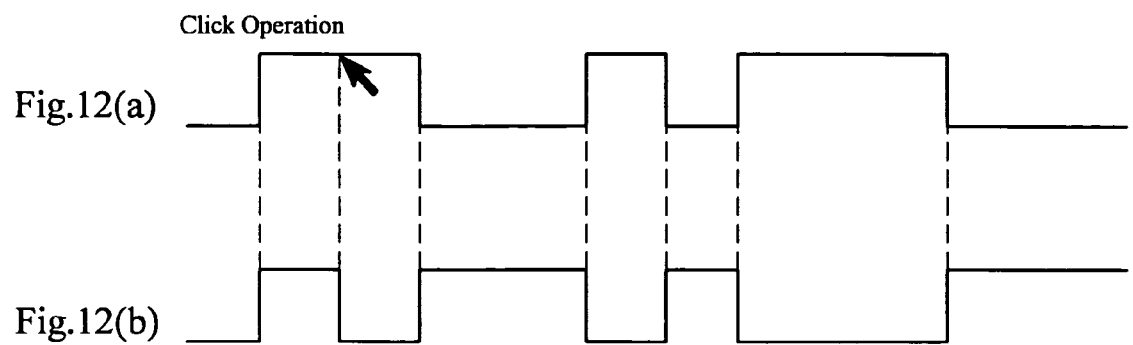
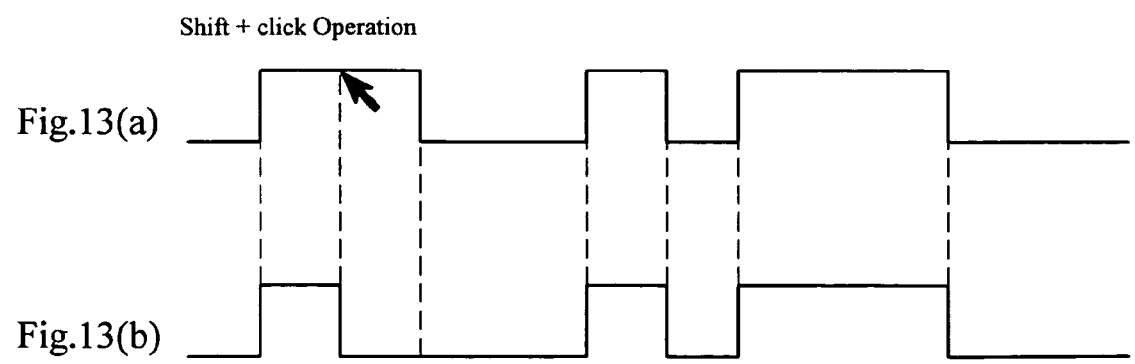

COMPUTER-READABLE RECORDING MEDIUM WITH WAVEFORM EDITING PROGRAM STORED AND WAVEFORM EDITING SYSTEM

BACKGROUND OF THE INVENTION

1. Field of the Invention

The present invention relates to a computer-readable recording medium with a waveform editing program stored and a waveform editing system and, more particularly, to a computer-readable recording medium with a waveform editing program stored for implementing the editing of waveforms generated based on data input through an input device or data captured from an outside source and a waveform editing system.

2. Description of the Relevant Art

Hitherto, in order to efficiently design and evaluate an electronic control unit for controlling a vehicle engine and the like, simulations of behavior of a controlled apparatus using a simulator (or computations using a mathematized vehicle model) have been performed, in place of various kinds of measurements such as operating conditions with the electronic control unit connected to a real controlled apparatus such as a vehicle.

The simulator has features of a waveform editing system which generates and displays waveforms (such as analog signal waveforms or digital signal waveforms) of data of various types output to the electronic control unit.

The waveform editing system comprises a display device consisting of a CRT, an LCD and associated parts, an input device consisting of a keyboard, a mouse and associated parts, and a microcomputer which controls those. In a ROM inside the microcomputer, a waveform editing program for editing waveforms of data of various kinds output to the electronic control unit is stored, and in the microcomputer, the waveform edit processing based on the waveform editing program is conducted.

The microcomputer reads the waveform editing program from the ROM in response to a command of program startup from the input device, displays a waveform editing screen on the display device, and generates signal waveforms of data of various kinds output to the electronic control unit based on data input through the input device or simulated data for display on the waveform editing screen. However, since the conventional waveform editing system has limited operability in the waveform editing, an evaluator has carried out the waveform editing with finding its use inconvenient.

In the Japanese Kokai No. 98-148546, as an example of an improved screen display device for improving the workability, described are that a correlation diagram drawing area and a detailed data view area are arranged on a screen of a correlation diagram display device, and that when an arbitrary plot of a correlation diagram shown in the correlation diagram drawing area is selected by an operator, detailed data corresponding to the selected plot is numerically shown in the detailed data view area. However, in the detailed data view area, only the detailed data corresponding to the selected plot is shown. In order to display detailed data of other plots, a plot selection line must be placed at a desired plot by operating the cursor, as occasion demands, resulting in burdensome operations.

The conventional waveform editing system does not have a function of superimposing and displaying an analog waveform and binary waveforms when analog signals expressible with the analog waveform are output after converted to digital signals expressible with the binary waveforms, or when digital signals expressible with the binary waveforms are output after converted to analog signals, a function of displaying coordinate data of points constituting a waveform and the waveform on the same screen, a function of superimposing multiple waveforms for display so as to edit these waveforms easily with comparisons of them with one another, and a function of preventing errors in the editing of binary waveforms or easily editing binary waveforms or an analog waveform, resulting in no enhanced efficiency in editing operations.

SUMMARY OF THE INVENTION

The present invention was achieved in order to solve the above problems, and it is an object of the present invention to provide a computer-readable recording medium with a waveform editing program stored, the waveform editing program whereby waveforms of different types generated based on prescribed data are displayed on the same screen, so that the characteristics of the waveforms can be easy to know, with improved operability in the waveform editing, desired waveforms can be easily generated, and multiple waveforms generated from separate data are displayed on the same screen, so that efficient waveform editing conducted with consideration given to relations between the waveforms can be implemented, and a waveform editing system.

In order to achieve the above object, a computer-readable recording medium with a waveform editing program stored according to the first aspect of the present invention is characterized by allowing a waveform editing system comprising at least a display device to display waveforms on a screen and an input device enabling input operations, which can display a waveform generated based on data input through the input device or data captured from an outside source on the screen, to implement a first waveform display function of superimposing and displaying an analog waveform based on prescribed data and binary waveforms based on the prescribed data.

Using the computer-readable recording medium with a waveform editing program stored according to the first aspect of the present invention, the analog waveform and the binary waveforms are superimposed for display. Therefore, when the data (analog signals) constituting the analog waveform is converted into digital signals of prescribed bit strings which can be expressed with the binary waveforms for output, it is possible to visually grasp as digital signals of what binary waveforms the analog signals of the analog waveform are output from each bit string. When the data captured from the outside is digital signals which can be expressed with the binary waveforms, an analog waveform generated by converting the digital signals to analog signals is superimposed over them for display, so that by making reference to the coordinate data shown by the analog waveform, the editing of the binary waveforms becomes easier, resulting in enhanced efficiency in the waveform editing.

Here, the analog waveform is a waveform whose data value continuously changes with time, including a waveform which is made by continuously connecting data values at certain times with a line, a curve or the like. The binary waveform is a waveform which is shown in such a manner as to repeat 0 and 1 or ON and OFF at prescribed intervals based on binary signals such as 0 and 1, or ON and OFF, and digital signals consisting of a prescribed number of bits can be expressed with the binary waveforms. As a result, it becomes possible to superimpose and display an analog waveform based on prescribed data (data showing analog signals) and waveforms (digital signal waveforms) showing binary signals of each bit of digital signals obtained by digital bit resolution of the prescribed data by the prescribed number of bits in the form of a binary waveform.

A computer-readable recording medium with a waveform editing program stored according to the second aspect of the present invention is characterized by allowing a waveform editing system comprising at least a display device to display waveforms on a screen and an input device enabling input operations, which can display a waveform generated based on data input through the input device or data captured from an outside source on the screen, to implement a coordinate data and waveform display function of displaying a coordinate data view area for showing coordinate data of points constituting the waveform and a waveform view area for showing a waveform generated based on the coordinate data or a waveform generated based on a point input operation on the same screen, and a coordinate data modification display function of modifying and displaying the coordinate data shown in the coordinate data view area when the waveform shown in the waveform view area is edited.

Using the computer-readable recording medium with a waveform editing program stored according to the second aspect of the present invention, by the coordinate data and waveform display function, the coordinate data view area and the waveform view area are shown on the same screen, and by the coordinate data modification display function, the coordinate data shown in the coordinate data view area is modified for display when the waveform shown in the waveform view area is edited. Therefore, the waveform can be edited in a state where the coordinate data of points of the waveform shown in the waveform view area is shown in the coordinate data view area, so that the points of the waveform can be accurately edited to desired coordinate positions, resulting in more accurate waveform editing and smooth editing operations.

A computer-readable recording medium with a waveform editing program stored according to the third aspect of the present invention is characterized by allowing a waveform editing system comprising at least a display device to display waveforms on a screen and an input device enabling input operations, which can display a waveform generated based on data input through the input device or data captured from an outside source on the screen, to implement a coordinate data and waveform display function of displaying a coordinate data view area for inputting and showing coordinate data of points constituting the waveform and a waveform view area for showing a waveform generated based on the coordinate data or a waveform generated based on a point input operation on the same screen, and a waveform modification display function of modifying and displaying the waveform shown in the waveform view area when the coordinate data shown in the coordinate data view area is edited.

Using the computer-readable recording medium with a waveform editing program stored according to the third aspect of the present invention, by the coordinate data and waveform display function, the coordinate data view area and the waveform view area are shown on the same screen, and by the waveform modification display function, the waveform shown in the waveform view area is modified for display when the coordinate data shown in the coordinate data view area is edited. Therefore, the waveform can be edited in a state where the coordinate data of points of the waveform shown in the waveform view area is shown in the coordinate data view area, so that by editing the coordinate data of the waveform to accurate values, accurate waveform editing can be conducted, resulting in smooth editing operations.

A computer-readable recording medium with a waveform editing program stored according to the fourth aspect of the present invention is characterized by allowing a waveform editing system comprising at least a display device to display waveforms on a screen and an input device enabling input operations, which can display a waveform generated based on data input through the input device or data captured from an outside source on the screen, to implement a coordinate data and waveform display function of displaying a coordinate data view area for showing coordinate data of points constituting the waveform and a waveform view area for showing a waveform generated based on the coordinate data or a waveform generated based on a point input operation on the same screen, a coordinate data maintaining function of grouping and maintaining coordinate data of multiple waveforms, a second waveform display function of superimposing the multiple waveforms maintained by the coordinate data maintaining function for display in the waveform view area, a waveform selection function which enables a selection of a prescribed waveform from among the multiple waveforms displayed by the second waveform display function, and a waveform information display function of displaying coordinate data of a selected waveform in the coordinate data view area when the waveform is selected by the waveform selection function.

Using the computer-readable recording medium with a waveform editing program stored according to the fourth aspect of the present invention, by the coordinate data maintaining function, coordinate data of multiple waveforms can be grouped and maintained, and by the second waveform display function, the multiple waveforms maintained by the coordinate data maintaining function can be superimposed for display, so that it is possible to make comparisons between the multiple waveforms at a time. By the waveform selection function, it becomes possible to easily select a prescribed waveform from among the multiple waveforms, and by the waveform information display function, the coordinate data of the selected waveform is shown in the coordinate data view area, so that the editing of points of the selected waveform to accurate coordinate positions can be made easier to perform. Particularly, when signals consisting of the multiple waveforms are output with the same timing, each waveform can be edited in a state where they are superimposed for display, resulting in enhanced efficiency in the editing of the multiple waveforms.

A computer-readable recording medium with a waveform editing program stored according to the fifth aspect of the present invention is characterized by allowing a waveform editing system comprising at least a display device to display waveforms on a screen and an input device enabling input operations, which can display a waveform generated based on data input through the input device or data captured from an outside source on the screen, to implement a binary waveform generation function of generating a binary waveform based on prescribed data and/or a prescribed input operation through the input device, a binary signal determination function of determining a binary signal indicated by the position of a cursor displayed on the screen when a binary waveform is generated by the binary waveform generation function, and a binary signal display function of displaying the binary signal determined by the binary signal determination function in proximity to the cursor.

Using the computer-readable recording medium with a waveform editing program stored according to the fifth aspect of the present invention, by the binary signal determination function, the binary signal at which the cursor is located is determined, and by the binary signal display function, the binary signal is shown in proximity to the cursor. Therefore, by making reference to the binary signal shown in proximity to the cursor, it becomes easy to grasp the binary signal at which the cursor is located, resulting in prevention of improper editing operations in the binary waveform editing.

A computer-readable recording medium with a waveform editing program stored according to the sixth aspect of the present invention is characterized by the binary waveform generation function, when a prescribed input operation is detected with a binary signal shown in proximity to the cursor by the binary signal display function, being to transform a binary waveform in a section where the cursor is located to a waveform expressing the binary signal in the computer-readable recording medium with a waveform editing program stored according to the fifth aspect of the present invention.

Using the computer-readable recording medium with a waveform editing program stored according to the sixth aspect of the present invention, it becomes possible to change the binary waveform in a section where the cursor is located to a waveform of the binary signal by making reference to the binary signal shown in proximity to the cursor. As a result, improper editing operations of the binary waveform can be avoided, resulting in easy changing to a desired binary waveform.

A computer-readable recording medium with a waveform editing program stored according to the seventh aspect of the present invention is characterized by allowing a waveform editing system comprising at least a display device to display waveforms on a screen and an input device enabling input operations, which can display a waveform generated based on data input through the input device or data captured from an outside source on the screen, to implement a binary waveform generation function of generating a binary waveform based on prescribed data and/or a prescribed input operation through the input device, and a first binary waveform reverse function of reversing the whole binary waveform after or before a section of an arbitrary point in the binary waveform when the point is designated with the binary waveform displayed on the screen.

Using the computer-readable recording medium with a waveform editing program stored according to the seventh aspect of the present invention, when an arbitrary point in the binary waveform is designated, the whole binary waveform after or before the point section is reversed for display by the first binary waveform reverse function. Therefore, the reverse editing by one operation of the binary waveform after or before the designated point section can be easily conducted, resulting in enhanced efficiency in the editing of the binary waveform.

A computer-readable recording medium with a waveform editing program stored according to the eighth aspect of the present invention is characterized by allowing a waveform editing system comprising at least a display device to display waveforms on a screen and an input device enabling input operations, which can display a waveform generated based on data input through the input device or data captured from an outside source on the screen, to implement a binary waveform generation function of generating a binary waveform based on prescribed data and/or a prescribed input operation through the input device, and a second binary waveform reverse function of reversing the binary waveform within a section of an arbitrary point in the binary waveform when the point is designated with the binary waveform displayed on the screen.

Using the computer-readable recording medium with a waveform editing program stored according to the eighth aspect of the present invention, when an arbitrary point in the binary waveform is designated, the binary waveform within the point section is reversed for display by the second binary waveform reverse function. Therefore, the reverse editing of only the binary waveform within the designated point section can be conducted, resulting in easy partial editing of the binary waveform.

A computer-readable recording medium with a waveform editing program stored according to the ninth aspect of the present invention is characterized by allowing a waveform editing system comprising at least a display device to display waveforms on a screen and an input device enabling input operations, which can display a waveform generated based on data input through the input device or data captured from an outside source on the screen, to implement a first frame definition function of defining an editing area frame for editing the waveform, an in-frame point movement function of moving the in-frame point according to the amount of scaling or transformation of the frame with the positional relation between the frame and the in-frame point held when a scaling or transformation operation of the frame defined by the first frame definition function is detected, and a first time-series waveform generation function of generating a time-series waveform from the in-frame point moved by the in-frame point movement function and other points of the waveform.

Using the computer-readable recording medium with a waveform editing program stored according to the ninth aspect of the present invention, by the in-frame point movement function, the in-frame point can be moved according to the amount of scaling or transformation of the frame with the positional relation between the editing area frame and the in-frame point kept, so that partial editing of the waveform can be easily performed, for example, in cases where the editing with the positional relation in part of the waveform kept is desired. Even if the time sequence of the in-frame point and other points of the waveform is reversed, a waveform wherein the in-frame point and the other points are connected in chronological order is generated by the first time-series waveform generation function, so that it is possible to save the trouble of regenerating a time-series waveform later, resulting in efficient waveform editing.

A computer-readable recording medium with a waveform editing program stored according to the tenth aspect of the present invention is characterized by the in-frame point movement function, being to add and move points of intersection of the frame defined by the first frame definition function and the waveform as new in-frame points in the computer-readable recording medium with a waveform editing program stored according to the ninth aspect of the present invention.

Using the computer-readable recording medium with a waveform editing program stored according to the tenth aspect of the present invention, the addition of the points of intersection of the frame and the waveform as new in-frame points makes it easy to determine the editing area of the waveform with the frame. By moving the waveform encircled by the frame according to the amount of scaling or transformation, the editing to a desired waveform becomes easier to perform.

A computer-readable recording medium with a waveform editing program stored according to the eleventh aspect of the present invention is characterized by allowing a waveform editing system comprising at least a display device to display waveforms on a screen and an input device enabling input operations, which can display a waveform generated based on data input through the input device or data captured from an outside source on the screen, to implement a second frame definition function of defining a copy area frame for copying the waveform, an in-frame waveform copy function of copying a waveform in the frame defined by the second frame definition function, and a second time-series waveform generation function of generating a time-series waveform from the in-frame point and other points of the waveform when a location definition operation of the in-frame waveform copied by the in-frame waveform copy function is detected.

Using the computer-readable recording medium with a waveform editing program stored according to the eleventh aspect of the present invention, the waveform in the copy area frame can be copied by the in-frame waveform copy function. When part of the waveform is desired to be copied as it is, the partial editing of the waveform can be easily conducted. In cases where there is another point of the waveform in the copied frame, a waveform wherein the point in the frame and other points of the waveform are connected in chronological order is generated by the second time-series waveform generation function, so that it is possible to save the trouble of regenerating a time-series waveform later, resulting in efficient waveform editing.

A computer-readable recording medium with a waveform editing program stored according to the twelfth aspect of the present invention is characterized by the second time-series waveform generation function, being to generate a time-series waveform with an existing point discarded when the existing point is in the frame after the location definition operation is performed in the computer-readable recording medium with a waveform editing program stored according to the eleventh aspect of the present invention.

Using the computer-readable recording medium with a waveform editing program stored according to the twelfth aspect of the present invention, in cases where an existing point is in the frame after the location definition operation is performed, the second time-series waveform generation function allows generation of a time-series waveform with the existing point discarded or with the point in the frame overwritten, so that it is possible to edit a waveform with priority given to the waveform pattern in the copy area frame.

A computer-readable recording medium with a waveform editing program stored according to the thirteenth aspect of the present invention is characterized by the in-frame waveform copy function, being to add and copy points of intersection of the frame defined by the second frame definition function and the waveform as new in-frame points in the computer-readable recording medium with a waveform editing program stored according to the eleventh or twelfth aspect of the present invention.

Using the computer-readable recording medium with a waveform editing program stored according to the thirteenth aspect of the present invention, the addition of the points of intersection of the frame and the waveform as new in-frame points makes it easy to determine the copy area of the waveform with the frame. A waveform having the form of a portion of the waveform encircled by the frame can be copied, so that the editing of copying a desired waveform becomes easier to perform.

A computer-readable recording medium with a waveform editing program stored according to the fourteenth aspect of the present invention is characterized by allowing a waveform editing system comprising at least a display device to display waveforms on a screen and an input device enabling input operations, which can display a waveform generated based on data input through the input device or data captured from an outside source on the screen, to implement a binary waveform generation function of generating a binary waveform based on prescribed data and/or a prescribed input operation through the input device, a third frame definition function of defining an editing area frame for editing the binary waveform generated by the binary waveform generation function, and an in-frame cycle modification function of modifying a binary waveform cycle in the frame according to the amount of scaling of the frame when a scaling operation of the frame defined by the third frame definition function is detected.

Using the computer-readable recording medium with a waveform editing program stored according to the fourteenth aspect of the present invention, by the in-frame cycle modification function, the binary waveform cycle in the frame is modified according to the amount of scaling of the frame when a scaling operation of the editing area frame is detected. Therefore, without changes in amplitude of the binary waveform, only the cycle can be varied, resulting in easy changing of the binary waveform cycle.

A computer-readable recording medium with a waveform editing program stored according to the fifteenth aspect of the present invention is characterized by allowing a waveform editing system comprising at least a display device to display waveforms on a screen and an input device enabling input operations, which can display a waveform generated based on data input through the input device or data captured from an outside source on the screen, to implement a third time-series waveform generation function of regenerating a time-series waveform from a moved point constituting the waveform and other points when a movement operation of the point is detected.

Using the computer-readable recording medium with a waveform editing program stored according to the fifteenth aspect of the present invention, when a movement operation of a point constituting the waveform is detected, by the third time-series waveform generation function, a waveform wherein the traveled point and the other points are connected in chronological order is regenerated. Therefore, it is possible to save the trouble of regenerating a time-series waveform later, resulting in efficient waveform editing.

A computer-readable recording medium with a waveform editing program stored according to the sixteenth aspect of the present invention is characterized by the third time-series waveform generation function, being to regenerate a waveform in chronological order when the time sequence of a moved point and any of other points is reversed in the computer-readable recording medium with a waveform editing program stored according to the fifteenth aspect of the present invention.

Using the computer-readable recording medium with a waveform editing program stored according to the sixteenth aspect of the present invention, when the time sequence of the traveled point and any of the other points is reversed, a waveform in chronological order can be regenerated, so that it becomes possible to generate a time-series waveform on every occasion.

A computer-readable recording medium with a waveform editing program stored according to the seventeenth aspect of the present invention is characterized by allowing a waveform editing system comprising at least a display device to display waveforms on a screen and an input device enabling input operations, which can display a waveform generated based on data input through the input device or data captured from an outside source on the screen, to implement a coordinate axis resolution unit selection function which enables selections of coordinate axis resolution units, and a coordinate data acquisition function of acquiring values of coordinate data of the waveform displayed on the screen in the coordinate axis resolution units selected by the coordinate axis resolution unit selection function.

Using the computer-readable recording medium with a waveform editing program stored according to the seventeenth aspect of the present invention, by the coordinate axis resolution unit selection function, the coordinate axis resolution units with consideration given to an output cycle of waveform signals and the like can be selected as necessary. By the coordinate data acquisition function, it is possible to acquire coordinate data effective on the output of waveform signals and the like in each of the coordinate axis resolution unit, so that the acquired coordinate data can be output with a predetermined timing, and it is possible to generate a waveform with coordinates of the point fit for the output timing added thereto.

A waveform editing system according to the first aspect of the present invention is characterized by comprising a storage device wherein any of the computer-readable recording media with a waveform editing program stored according to the first through seventeenth aspects of the present invention is stored, and a waveform edit processing device to read the waveform editing program from the storage device to perform the waveform edit processing.

Using the waveform editing system according to the first aspect of the present invention, the waveform edit processing according to any of the waveform editing programs according to the first through seventeenth aspects of the present invention stored in the storage device is performed.

BRIEF DESCRIPTION OF THE DRAWINGS

FIGS. 11(a)–11(c) are illustrations of a succession selection operation of a binary waveform, wherein FIG. 11(a) shows an example of a display on a succession selection screen, FIG. 11(b) shows digital signal waveforms before a succession selection and FIG. 11(c) shows digital signal waveforms after the succession selection;

FIGS. 12(a) and 12(b) are illustrations of an example of an editing operation of a binary waveform shown in the waveform view area;

FIGS. 13(a) and 13(b) are illustrations of an example of an editing operation of a binary waveform shown in the waveform view area;

DESCRIPTION OF THE PREFERRED EMBODIMENTS

Figure 1:
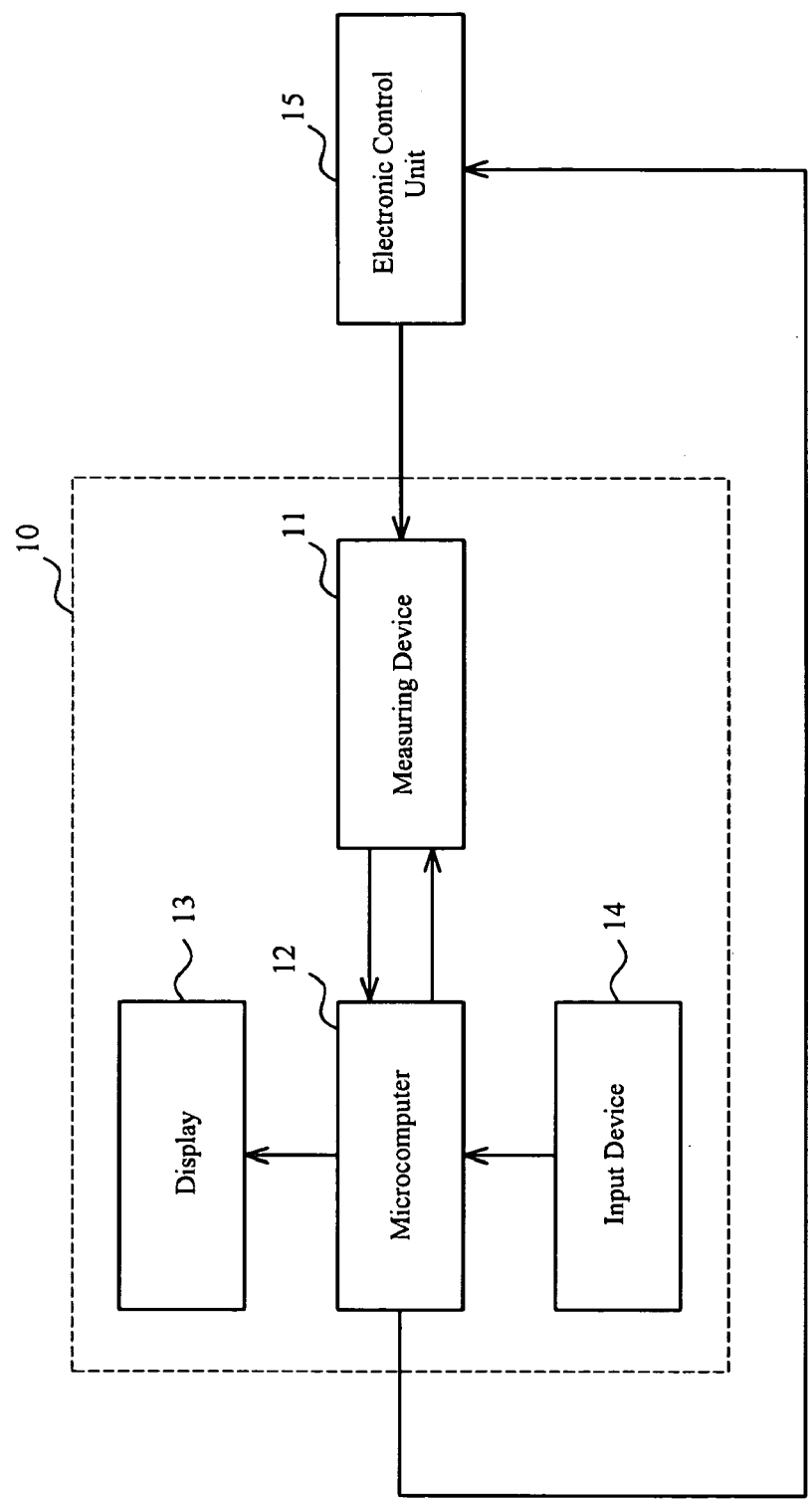
FIG. 1 is a block diagram schematically showing the principal part of a simulator in which a waveform editing system according to an embodiment of the present invention is adopted.

The preferred embodiments of the computer-readable recording medium with a waveform editing program stored thereon and the waveform editing system according to the present invention are described below by reference to those Figures. FIG. 1 is a block diagram schematically showing the principal part of a simulator in which a waveform editing system according to an embodiment is adopted.

A simulator 10 comprises a measuring device 11, a microcomputer 12, a display 13 and an input device 14. To the simulator 10, an electronic control unit 15, being an evaluated unit, is connected.

From the simulator 10 to the electronic control unit 15, data of various kinds which is necessary for driving the electronic control unit 15 is output. The electronic control unit 15 performs computations using the data from the simulator 10, and outputs various types of control signals to the measuring device 11 constituting the simulator 10.

The measuring device 11 simulatively computes the quantity of state of each part of a vehicle model based on the control signals sent from the electronic control unit 15 and each input element input through the input device 14, and provides the microcomputer 12 with the computation results. The microcomputer 12 estimates the operating conditions of controlled equipment (such as an engine) based on these data, and shows the results on the display 13 comprising a CRT, an LCD and associated parts.

In an internal ROM (not shown) of the microcomputer 12, a waveform editing program for displaying waveforms of data of various types showing analog signals expressed in analog value (consecutive physical quantity), digital signals expressed as binary signals and the like which are output to the electronic control unit 15 so as to allow the waveform editing to be conducted is stored. The microcomputer 12, according to an input operation through the input device 14 comprising the keyboard and the mouse, reads the waveform editing program from the internal ROM, and shows a waveform editing screen on the display 13, so that various types of waveform editing processing below-described such as inputting of numerical values with the keyboard or waveform display processing by mouse operations or the like is performed. A waveform editing system comprises these microcomputer 12, display 13 and input device 14.

Figure 2:
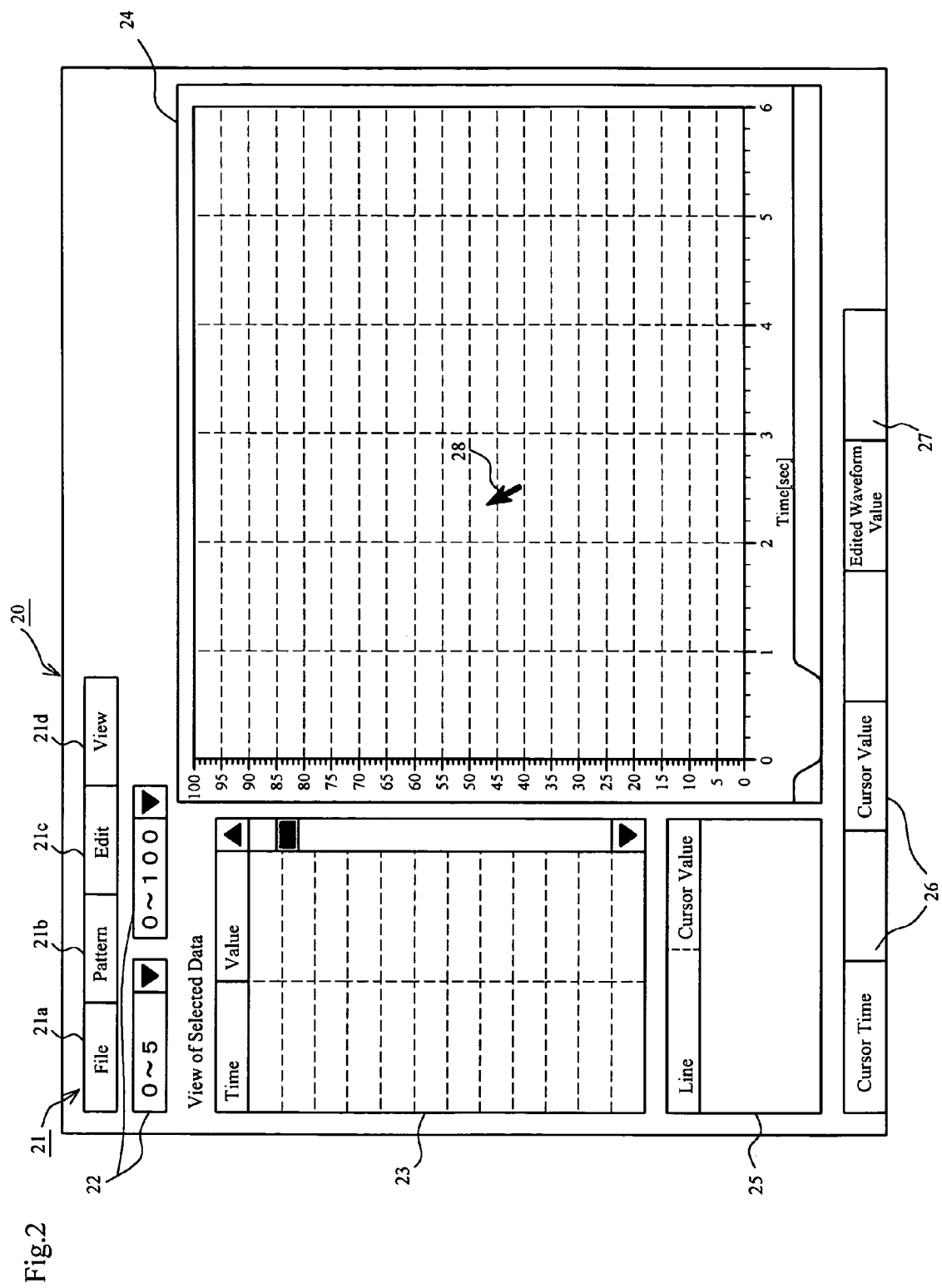
FIG. 2 is a diagram showing a screen layout of a waveform editing screen shown on a display.

FIG. 2 is a diagram showing a screen layout of a waveform editing screen shown on the display 13.

A waveform editing screen 20 comprises a menu section 21, a coordinate axis section 22, a coordinate data view area 23, a waveform view area 24, a waveform data view area 25, a cursor coordinate section 26 and an edited waveform data section 27.

The menu section 21 includes a File menu 21a for conducting operations such as a new creation of a file for storing a freshly generated waveform therein, a selection of a saved file, saving of a waveform in editing or ending of waveform editing, a Pattern menu 21b for conducting operations such as a new creation of a waveform, copying, a deletion or a movement to another file, an Edit menu 21c for conducting various kinds of edits of waveforms, and a View menu 21d for conducting selections of various kinds of views of waveforms.

In the coordinate axis section 22, selected ranges of the coordinate axes (a time axis and a value axis) of a waveform displayed in the waveform view area 24 are shown, and the ranges of the coordinate axes can be selected therein by inputting numerical values to the input box of each coordinate.

In the coordinate data view area 23, coordinate data (time and value) corresponding to points constituting a waveform selected in the waveform view area 24 is shown, and it is possible to input coordinate data to each cell therein through the input device 14.

In the waveform view area 24, a freshly generated waveform or a waveform stored in a file can be read for display. When coordinate data of multiple waveforms is grouped and maintained in the file, these multiple waveforms are displayed on the same time axis. In order to make a selected waveform known at a glance, each point constituting the waveform is marked with a coordinate mark (such as a black dot), and it is possible to conduct various kinds of editing operations on the waveform through the input device 14 such as the mouse.

In the waveform data view area 25, the values of all of the waveforms at a time indicated by the cursor 28 appearing in the waveform view area 24 are shown. In the cursor coordinate section 26, the position coordinates of the cursor 28 appearing in the waveform view area 24 are shown. And in the edited waveform data section 27, the value of the currently selected waveform at the time indicated by the cursor 28 is shown.

Figure 3:
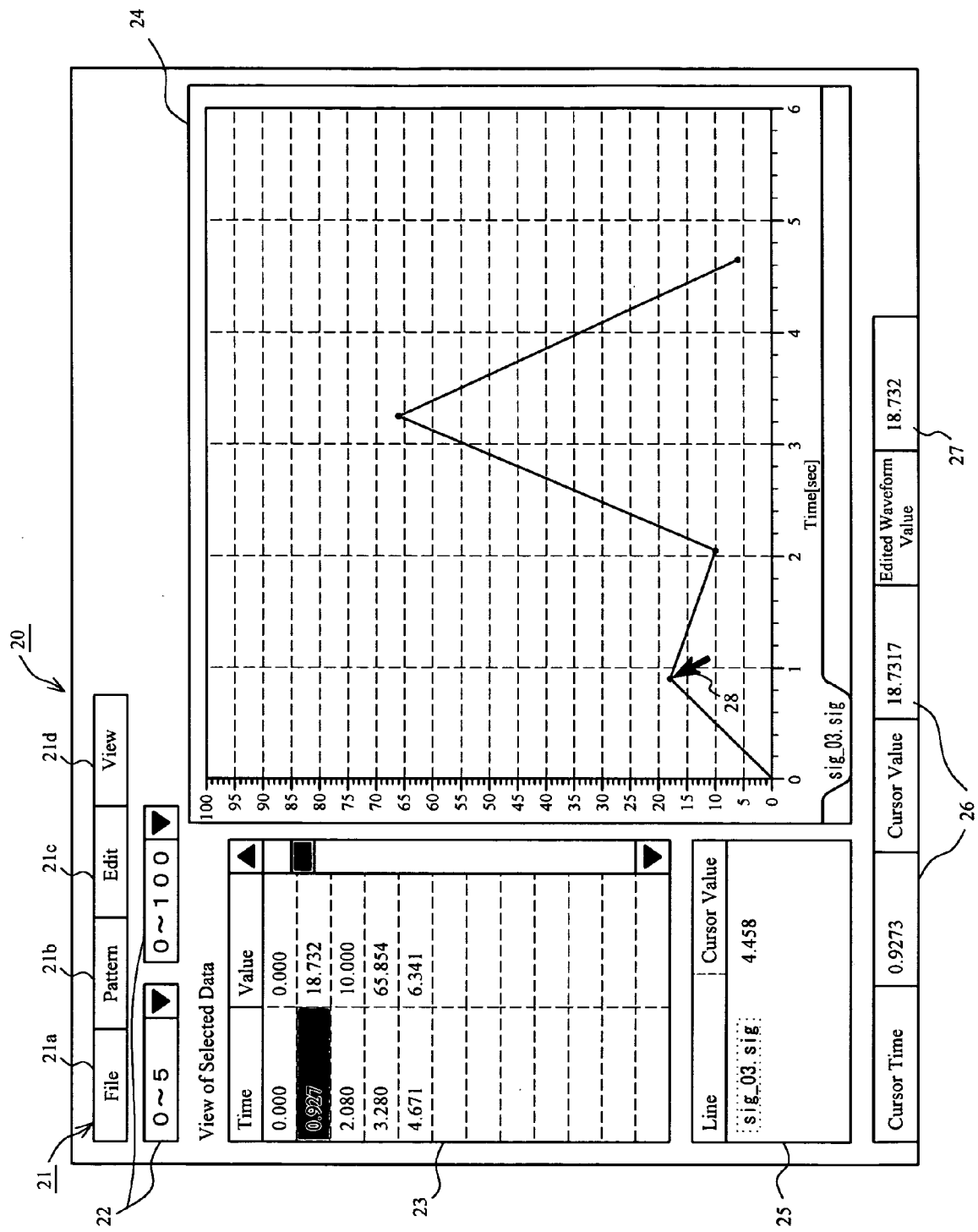
FIG. 3 is a diagram showing an example of a screen display when an analog waveform is generated on the waveform editing screen shown on the display.

FIG. 3 is a diagram showing an example of a screen display when an analog waveform is generated on the waveform editing screen 20 shown on the display 13. FIGS. 4(a)–9(e) are illustrations of examples of editing operations of analog waveforms shown in the waveform view area 24.

In FIG. 3, coordinate data (time and value) of points constituting an analog waveform shown in the waveform view area 24 is shown in the coordinate data view area 23. For example, when coordinate data is input to cells of the coordinate data view area 23 through the keyboard, a coordinate mark (a filled-in circle) indicating a point appears at a coordinate position corresponding to the input coordinate data in the waveform view area 24, and an analog waveform formed by connecting the input point and existing points in chronological order is shown.

In the waveform view area 24, when the cursor 28 is moved to a position to which a point is desired to be added and a determination operation with the mouse such as a double click operation is conducted, a coordinate mark indicating a point is additionally shown at the position of the cursor, and an analog waveform formed by connecting the point and existing points in chronological order is shown. At this time, in the coordinate data view area 23, coordinate data corresponding to the point added to the waveform view area 24 is additionally shown.

Examples of editing operations of analog waveforms shown in the waveform view area 24 are described below by reference to FIGS. 4(a)–9(e).

Figure 4A:
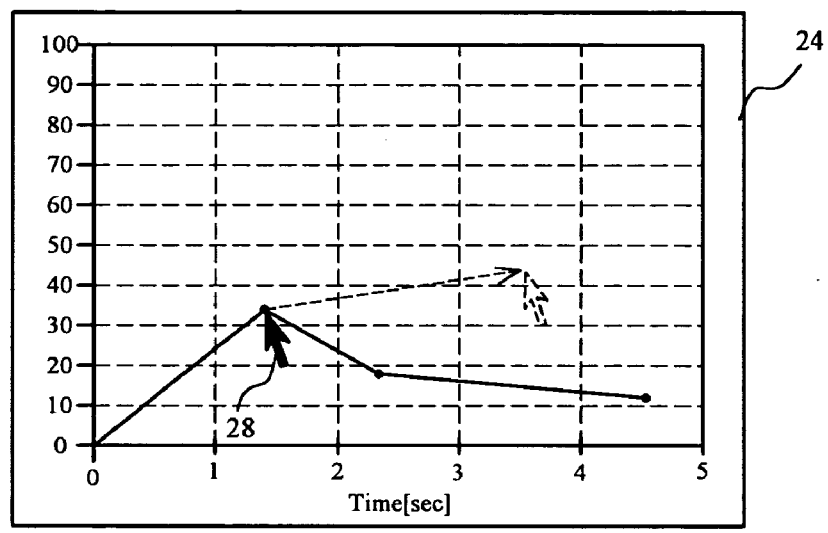
FIGS. 4(a) and 4(b) are illustrations of an example of an editing operation of an analog waveform shown in a waveform view area.
Figure 4B:
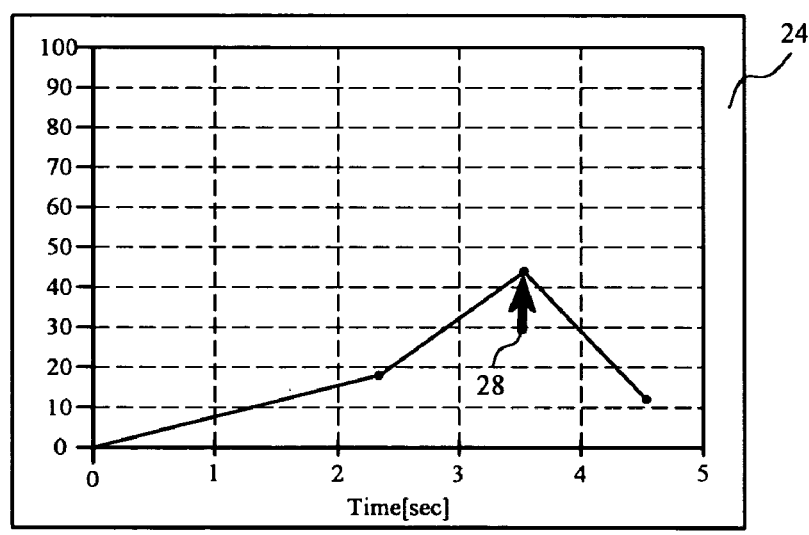

In the waveform view area 24, by placing the cursor 28 at an arbitrary point of an analog waveform as shown in FIG. 4(a) and conducting a drag and drop operation with the mouse to the position shown by a broken line arrow (FIG. 4(a)), the point at which the cursor 28 is placed can be moved to an arbitrary coordinate position. When the time sequence of the point at which the cursor 28 is placed and other points is changed because of the point movement, a waveform wherein the points are connected so as to be a time-series waveform is shown (FIG. 4(b)).

Figure 5A:
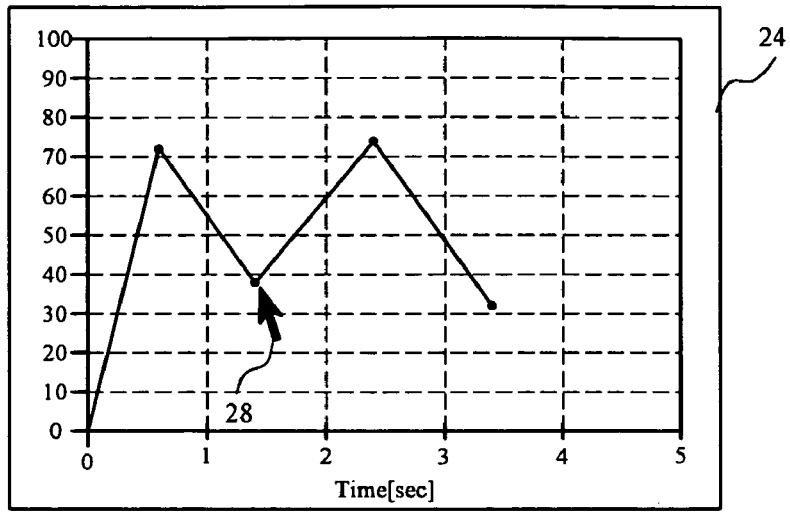
FIGS. 5(a)–5(c) are illustrations of an example of an editing operation of an analog waveform shown in the waveform view area.
Figure 5B:
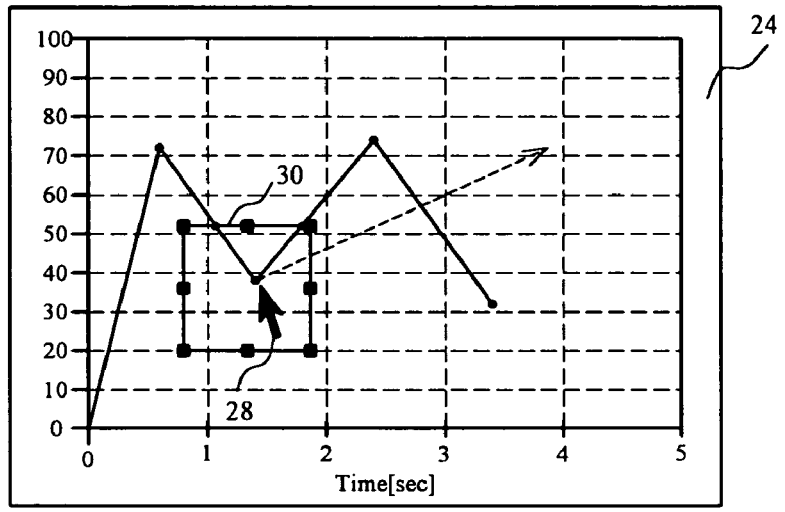
Figure 5C:
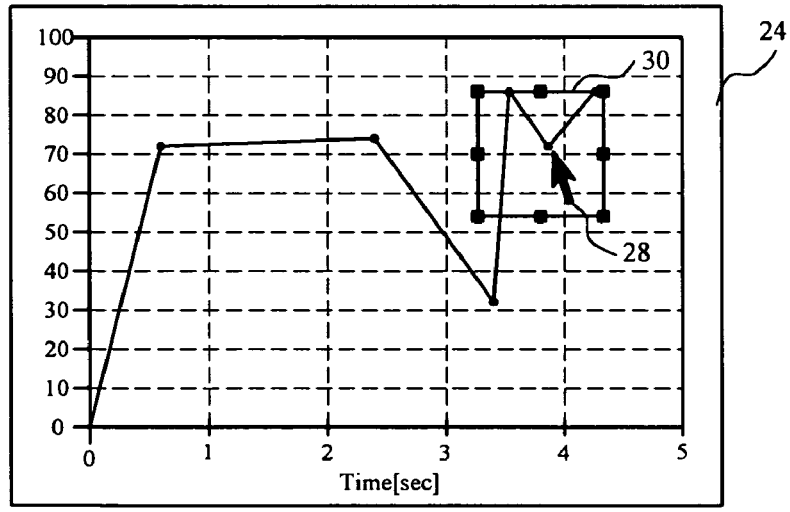

As shown in FIGS. 5(a)–5(c), when an operation of displaying a waveform movement frame 30 is conducted in a state where an analog waveform is shown in the waveform view area 24 (FIG. 5(*a*)), the defined waveform movement frame 30 with the cursor position almost in the center thereof appears. By conducting a drag and drop operation to a location shown by a broken line arrow (FIG. 5(*b*)), the waveform within the waveform movement frame 30 can be moved to an arbitrary location with the shape thereof held as it is (FIG. 5(*c*)). Likewise in this case, when the time sequence of the point within the frame and other points is changed, a waveform wherein the points are connected so as to be a time-series waveform is shown.

Figure 6A:
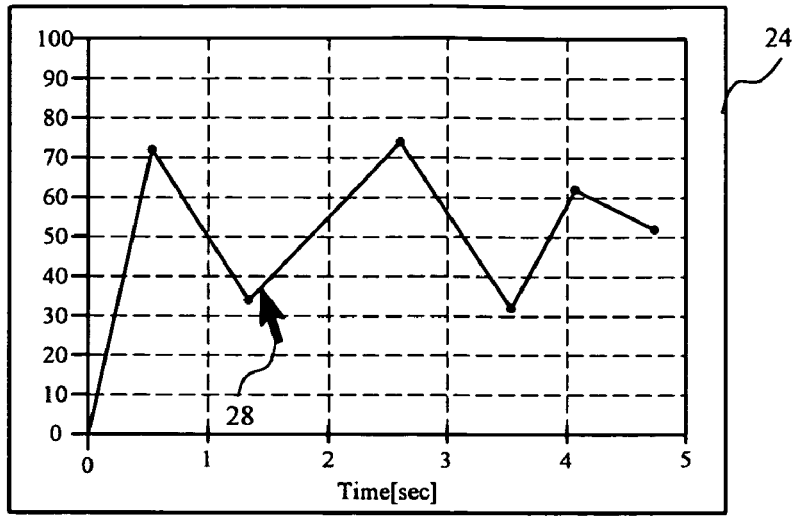
FIGS. 6(a)–6(c) are illustrations of an example of an editing operation of an analog waveform shown in the waveform view area.
Figure 6B:
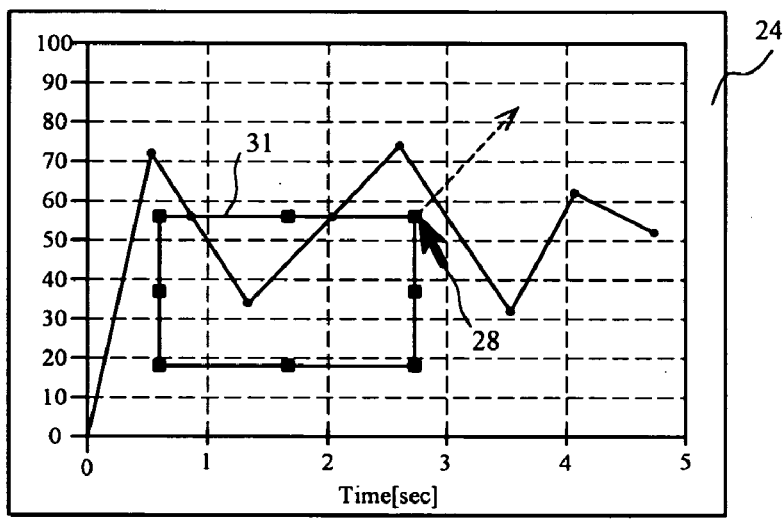
Figure 6C:
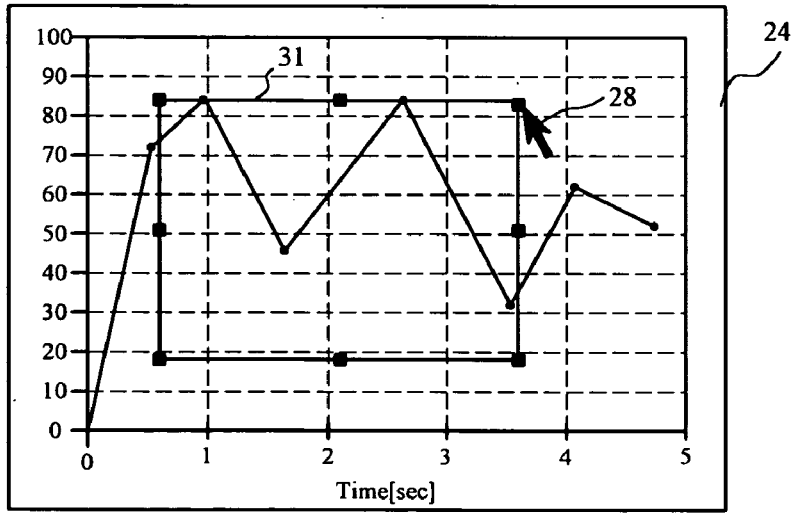

As shown in FIGS. 6(*a*)–6(*c*), when an operation of displaying an editing area frame (hereinafter, referred to as an editing frame) 31 is conducted in a state where an analog waveform is shown in the waveform view area 24 (FIG. 6(*a*)), the editing frame 31 appears at a position designated by the cursor 28 (FIG. 6(*b*)). By placing the cursor 28 at a corner of the editing frame 31 and conducting a mouse drag operation in a slanting direction shown by a broken line arrow, the waveform within the editing frame 31 can be enlarged to any size with the positional relation between the editing frame 31 and the point within the frame held (FIG. 6(*c*)). When the time sequence of the point within the editing frame 31 before the enlargement and other points is changed after the enlargement, a waveform wherein the points are connected so as to be a time-series waveform is shown, similarly to the above. The editing frame 31 can be also reduced.

Figure 7A:
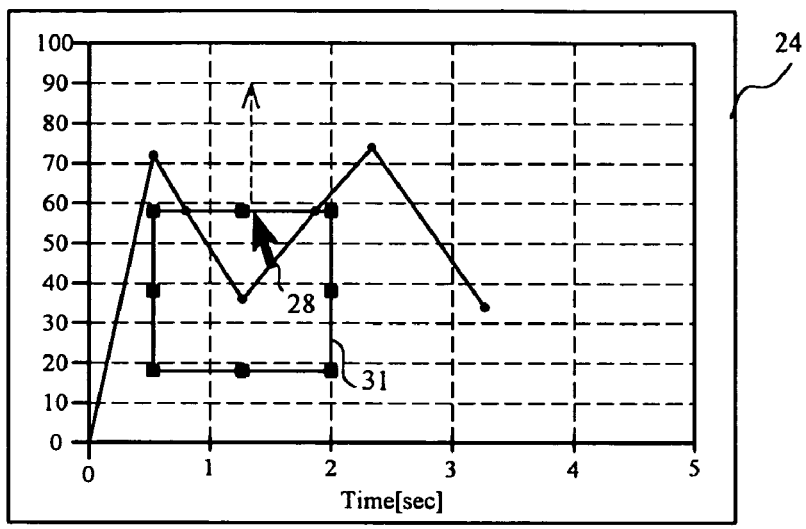
FIGS. 7(a) and 7(b) are illustrations of an example of an editing operation of an analog waveform shown in the waveform view area.
Figure 7B:
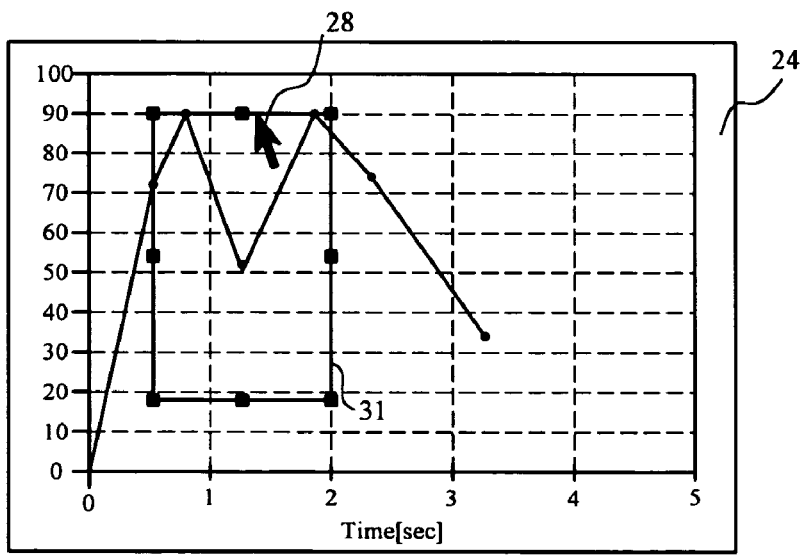

As shown in FIGS. 7(*a*) and 7(*b*), by placing the cursor 28 on the upper side of the editing frame 31 and conducting a mouse drag operation upward, the editing frame 31 can be enlarged upward with the positional relation between the editing frame 31 and the point within the frame held so as to move the point within the frame. The editing frame 31 can be also reduced downward.

Figure 8A:
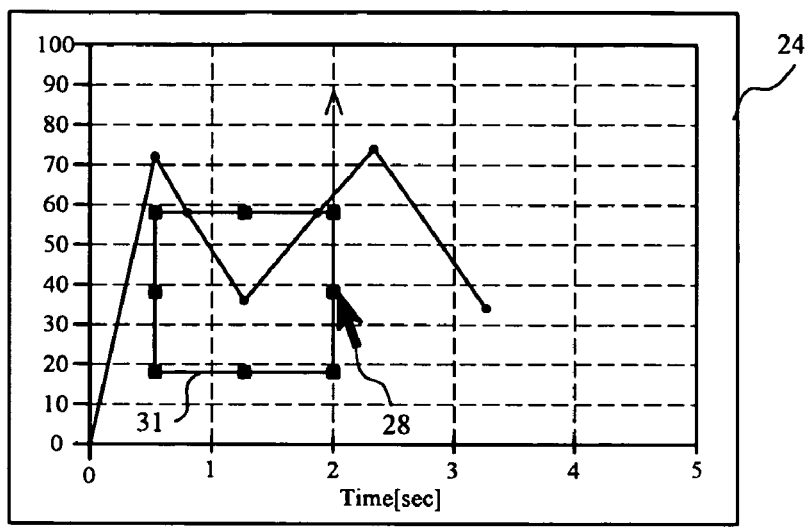
FIGS. 8(a) and 8(b) are illustrations of an example of an editing operation of an analog waveform shown in the waveform view area.
Figure 8B:
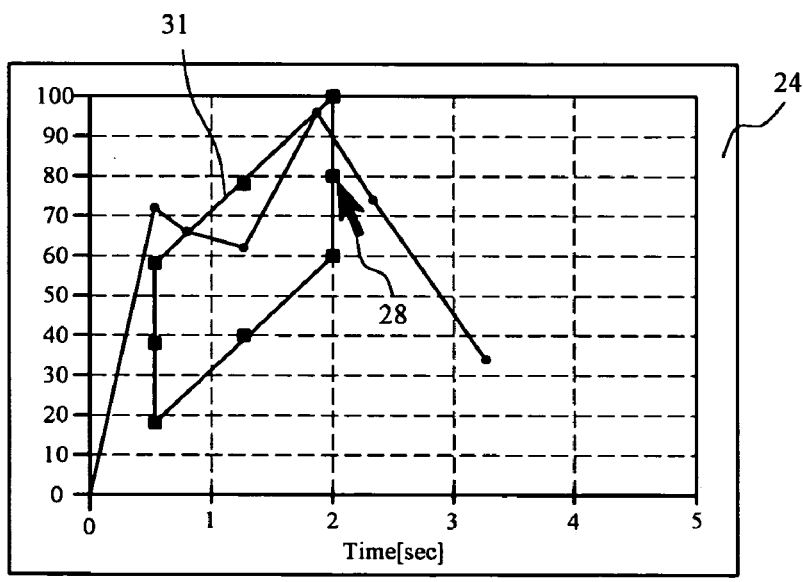
Figure 9A:
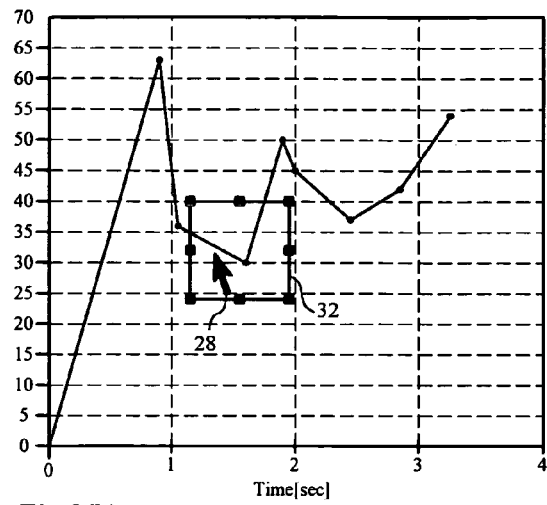
FIGS. 9(a)–9(e) are illustrations of an example of an editing operation of an analog waveform shown in the waveform view area.
Figure 9B:
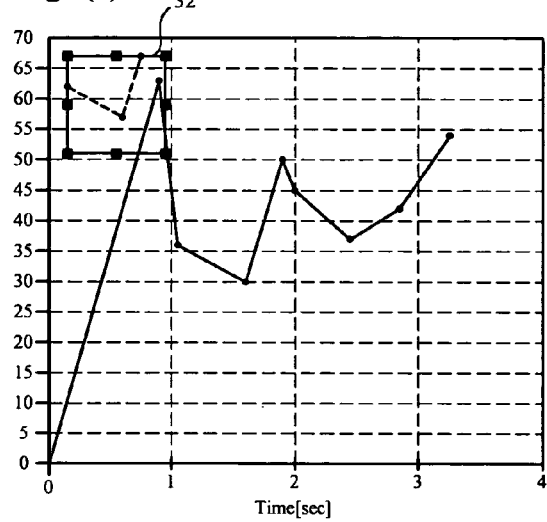
Figure 9C:
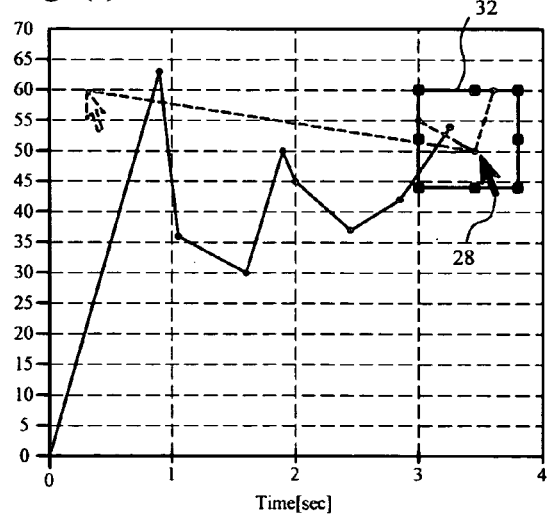
Figure 9D:
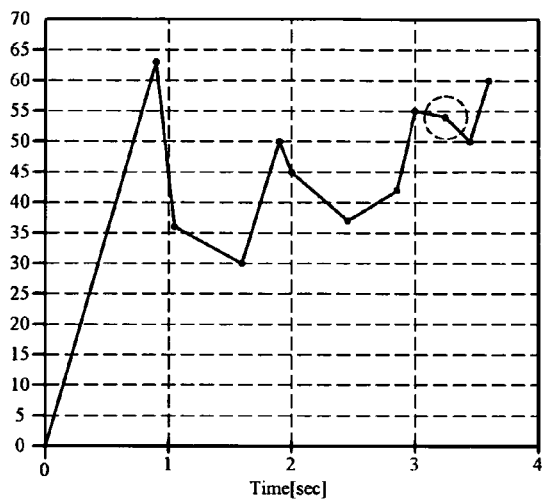
Figure 9E:
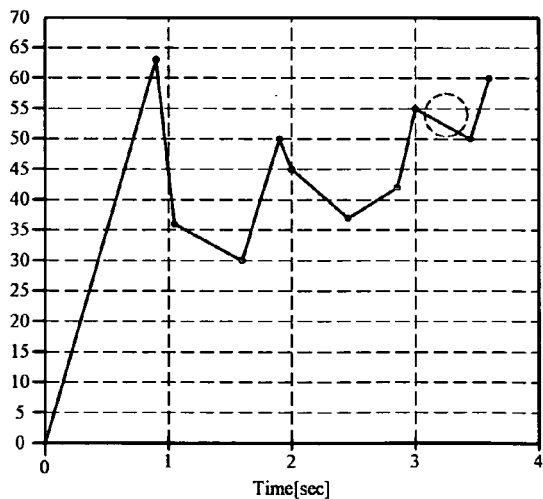

As shown in FIGS. 8(*a*) and 8(*b*), by placing the cursor 28 on either of the left and right sides of the editing frame 31 (the right side in FIG. 8) and conducting a mouse drag operation upward or downward, the editing frame 31 can be transformed to the form of a parallelogram with the positional relation between the editing frame 31 and the point within the frame held so as to move the point within the frame.

As shown in FIGS. 9(*a*)–9(*e*), when an operation of displaying a copy area frame (hereinafter, referred to as a copy frame) 32 is conducted in a state where an analog waveform is shown in the waveform view area 24, the defined copy frame 32 with the cursor position almost in the center thereof appears (FIG. 9(*a*)), and a copy of the waveform within the copy frame 32 is displayed (FIG. 9(*b*)). By conducting a drag and drop operation to a location shown by a broken line arrow, the waveform within the copy frame 32 can be moved to an arbitrary location with the shape held as it is (FIG. 9(*c*)).

When a Pasting operation is selected, as shown in FIG. 9(*d*), a waveform wherein the point within the moved copy frame 32 and an existing point within the copy frame 32 (a point in a circled location) are connected in chronological order is displayed. When an Overwriting operation is selected, as shown in FIG. 9(*e*), a time-series waveform with the existing point within the moved copy frame 32 (the point existed in the circled location) discarded is displayed.

Figure 10:
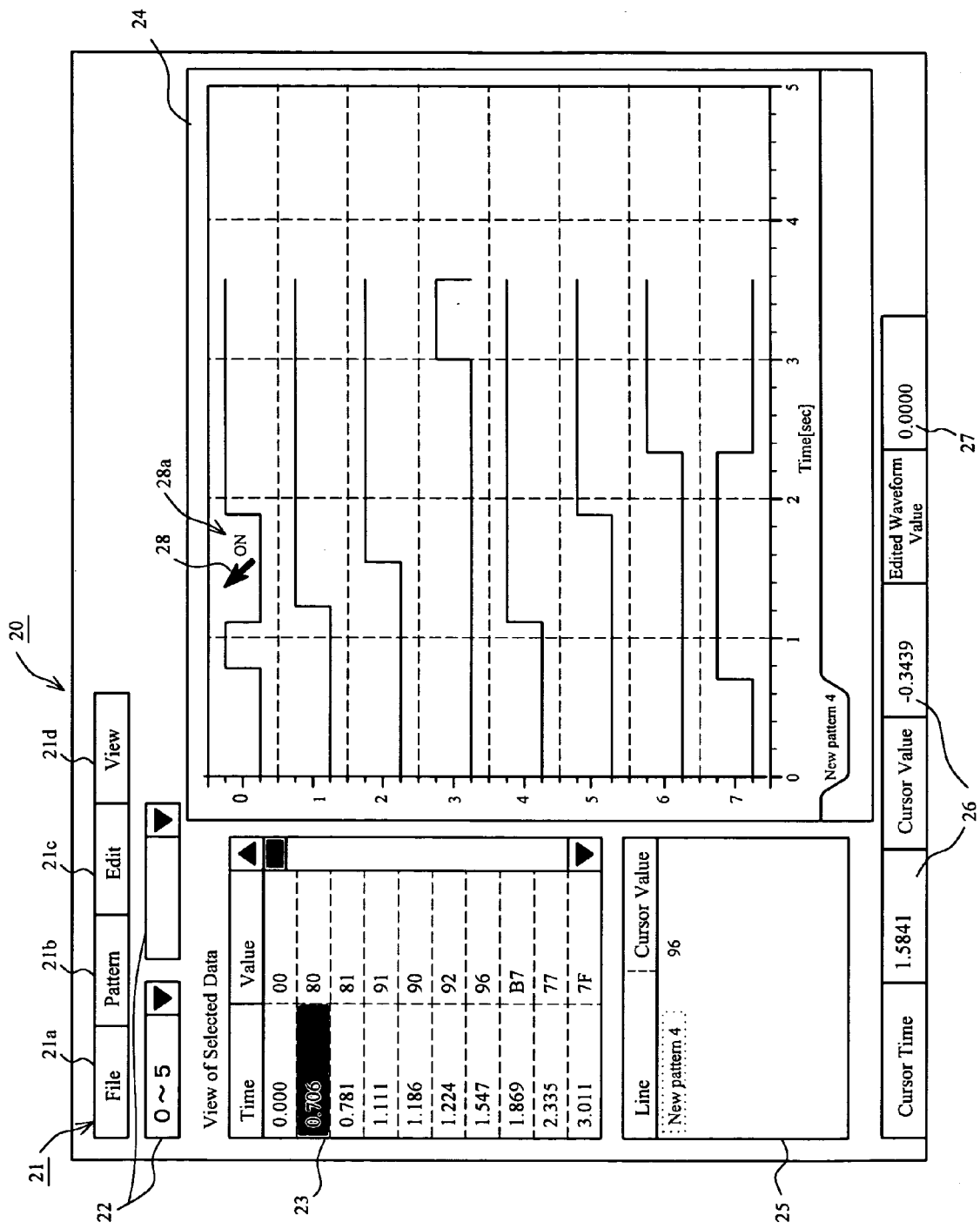
FIG. 10 is a diagram showing an example of a screen display when digital signal waveforms are generated on the waveform editing screen shown on the display.
Figure 11A:
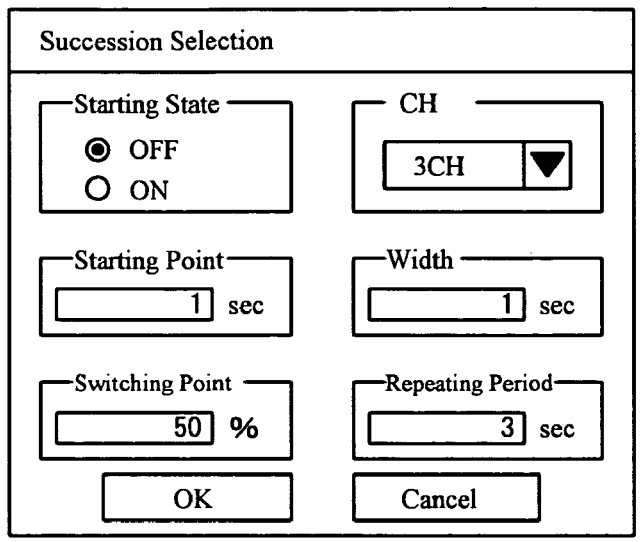
Figure 11B:
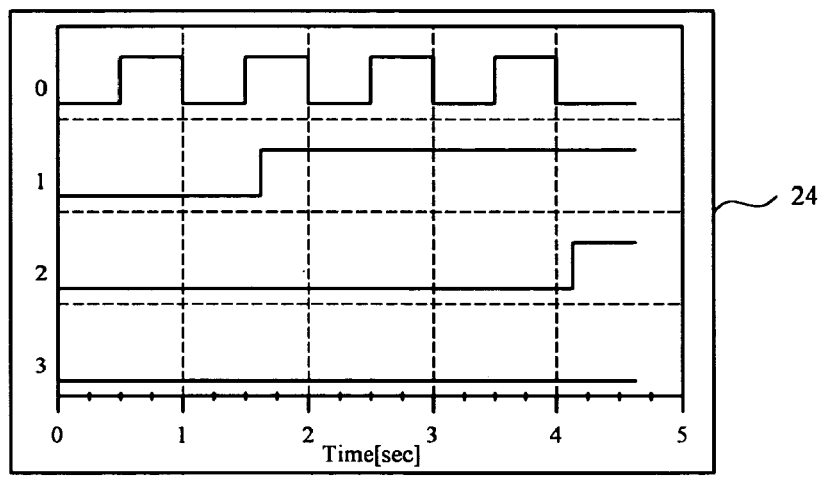
Figure 11C:
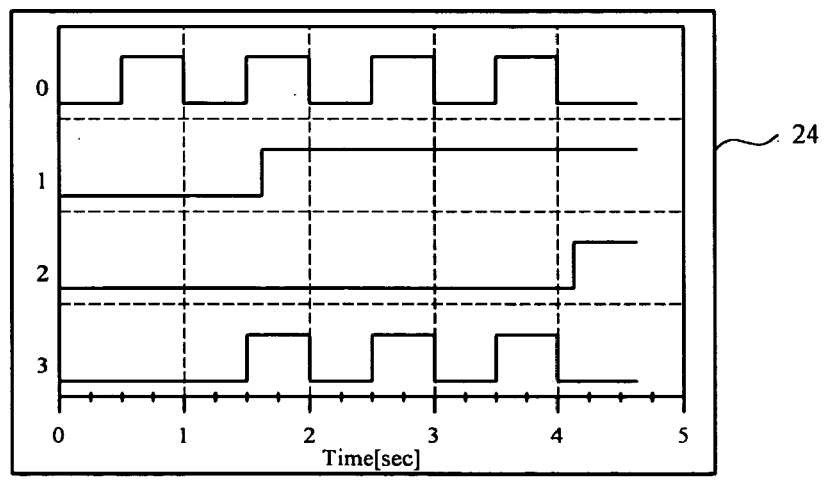

FIG. 10 is a diagram showing an example of a screen display when digital signal waveforms are generated on the waveform editing screen 20 shown on the display 13. FIGS. 11(*a*)–14(*b*) are illustrations of examples of editing operations of digital signal waveforms shown in the waveform view area 24.

In FIG. 10, coordinate data (time and value (binary code, hexadecimal code or the like)) corresponding to waveform changing points of digital signal waveforms shown in the waveform view area 24 is shown in the coordinate data view area 23. When new coordinate data is input to the coordinate data view area 23, a digital signal waveform corresponding to the coordinate data is generated and shown in the waveform view area 24.

In the waveform view area 24, digital signal waveforms consisted of binary data (ON and OFF, etc.) of a predetermined number of channels (8 channels (8 bits) in FIG. 10) are shown, and an editing operation of digital signal waveforms can be conducted by a mouse operation and the like.

For example, when the cursor 28 is located above an OFF-state digital signal waveform as shown in FIG. 10, an ON mark 28*a* appears in proximity to the cursor 28. When a left mouse button click operation is conducted in this situation, the OFF-state section where the cursor 28 is located is changed to an ON-state binary waveform for display. When the cursor 28 is located below an ON-state digital signal waveform, an OFF mark (not shown) appears in proximity to the cursor 28. When a left mouse button click operation is conducted in this situation, the ON-state section where the cursor 28 is located is changed to an OFF-state binary waveform for display.

In another editing operation, when the tip of the arrow of the cursor 28 is in the upper half with the boundary at the midpoint of the amplitude of a binary waveform, an ON mark appears in proximity to the cursor 28, while an OFF mark appears in proximity to the cursor 28 when it is in the lower half. When a left mouse button click operation is conducted in such situations as the ON or OFF mark is shown, the section where the cursor 28 is located may be changed to an ON- or OFF-state binary waveform for display.

When the cursor 28 is placed in the waveform view area 24 and a right mouse button click operation is conducted in the case of digital signal waveforms being displayed, a pop-up menu (not shown) including various types of setting items appears. When Succession Selection in the setting items is selected, a succession selection screen of a binary waveform shown in FIG. 11(*a*) is displayed.

The succession selection screen contains a starting state select box for selecting a binary signal (here, ON or OFF) at the starting of the succession selection, a channel (CH) select box for selecting a programmed channel number (a bit string number), a starting point definition box for defining the starting time of the selection, a width definition box for defining the width (pulse cycle) of the waveform, a switching point definition box for defining the switching point (duty ratio) of ON/OFF of the waveform, and a repeating period definition box for defining the period in which the waveform is repeated.

When OK is input after conducting each selection in these boxes, based on the input conditions on the succession selection screen shown in FIG. 11(*a*), binary waveforms shown in FIG. 11(*c*) are generated from binary waveforms shown in FIG. 11(*b*). In the diagrams shown in FIGS. 11(*b*) and 11(*c*), the channel number is set on the vertical axis, while the time is set on the lateral axis. In FIG. 11(*c*), successive short-type waves are added for display on CH 3 in 1–4 sec. Thus it is possible to generate successive short-type waves on a designated channel number in an arbitrary time period for addition to the binary waveform.

When the cursor 28 is located on a binary waveform, and a left mouse button click operation is conducted as shown in FIG. 12(*a*), the whole waveform after the point section where the cursor 28 is located can be reversed for display as shown in FIG. 12(*b*). It is also possible to select a reverse display of the whole binary waveform before the point section where the cursor 28 is located.

When the cursor 28 is located on a binary waveform, and a left mouse button click operation is conducted with a shift key, for example, on the keyboard kept pressed as shown in FIG. 13(*a*), only the binary waveform in the point section where the cursor 28 is located can be reversed for display as shown in FIG. 13(*b*).

Figure 14A:
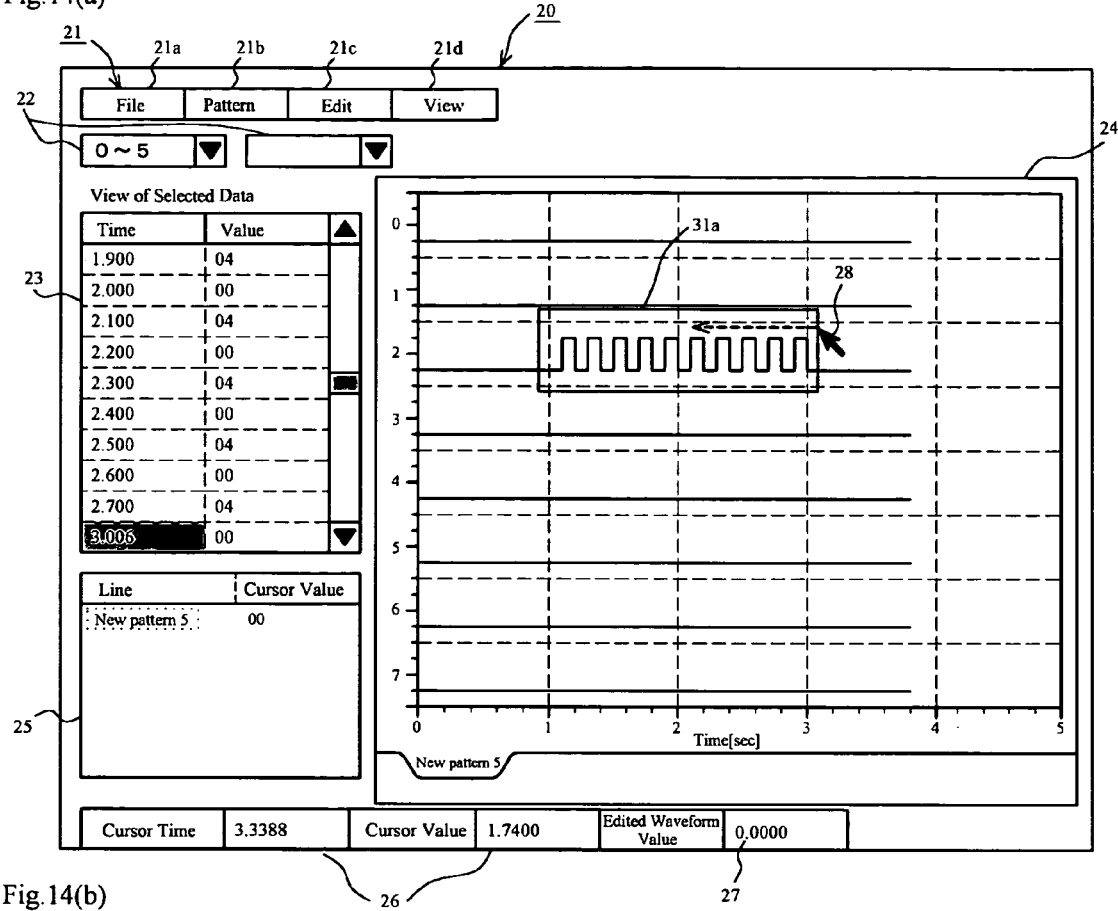
FIGS. 14(a) and 14(b) are illustrations of an example of an editing operation of a digital signal waveform shown in the waveform view area.
Figure 14B:
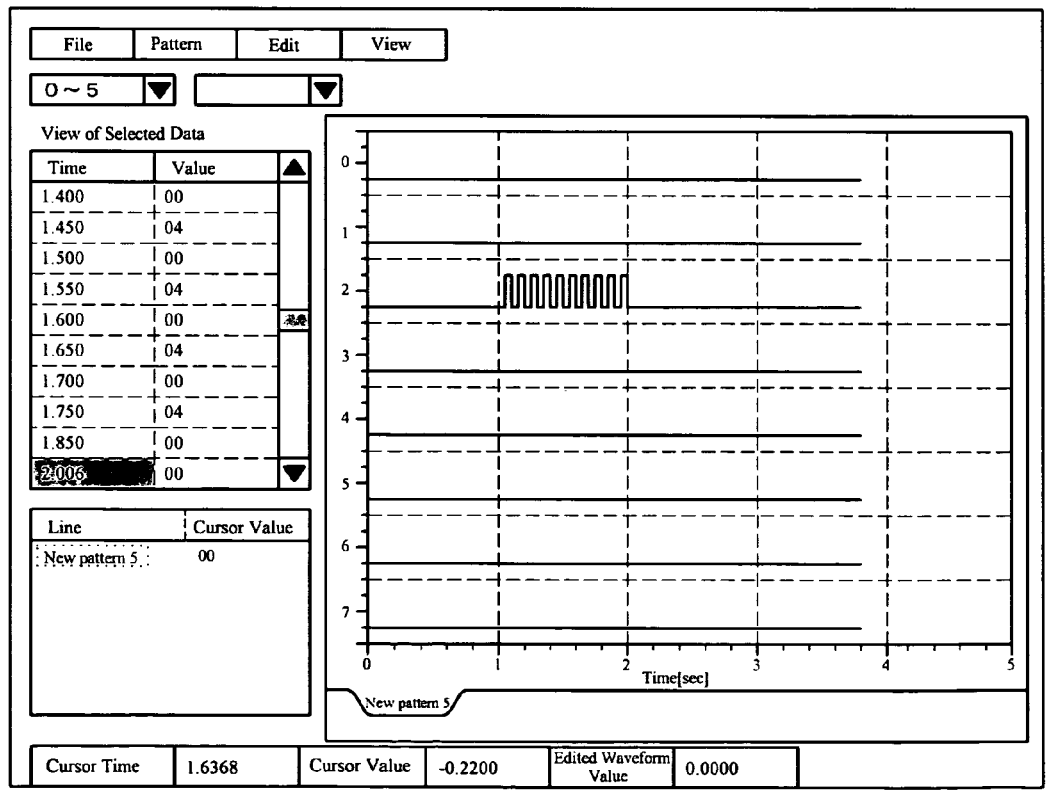

When an operation of displaying an editing frame 31*a* is conducted in a state where digital signal waveforms are shown in the waveform view area 24 as shown in FIG. 14(*a*), the editing frame 31*a* can be shown at a designated place. And when the cursor 28 is placed on either of the left and right sides of the editing frame 31*a* and a horizontal mouse drag operation is conducted, the pulse shape cycle within the frame is changed (FIG. 14(*b*)).

As still another editing operation, when the cursor 28 is moved to a region where the editing of the binary waveform is desired, a pop-up menu (not shown) is shown by a right mouse button click operation and a menu, either Selected Range ON or Selected Range OFF, is selected, a frame defining the range of the Selected Range ON or Selected Range OFF is shown. When the frame is scaled by a mouse operation, for example, to set the editing range and a double click operation within the frame is detected, it is also possible to change the binary waveform within the frame to an ON- or OFF-state binary waveform for display according to the menu selection.

Figure 15:
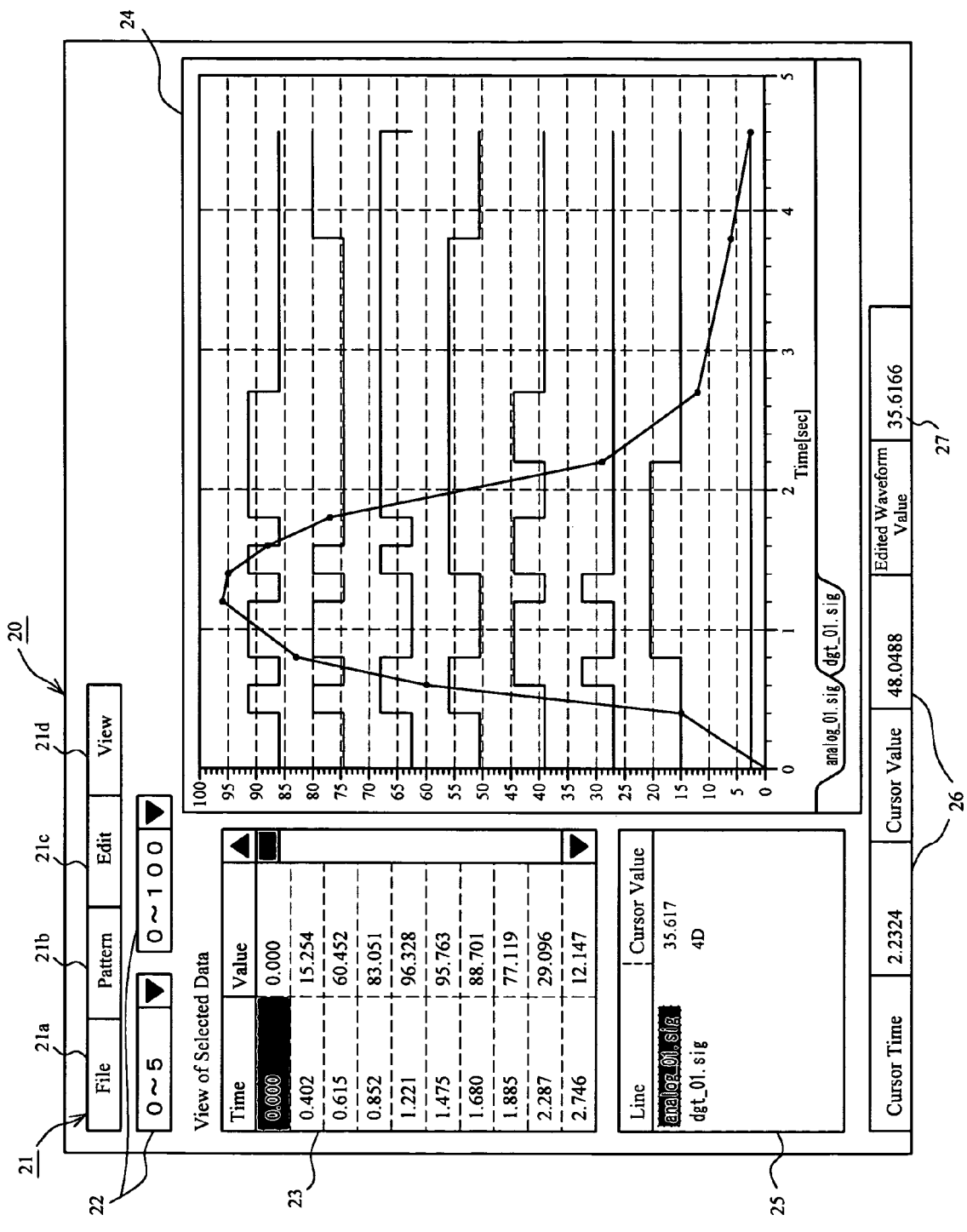
FIG. 15 is a diagram showing an example of a screen display when digital signal waveforms and an analog waveform are superimposed for display on the waveform editing screen.

FIG. 15 is a diagram showing an example of a screen display when an analog waveform and digital signal waveforms are superimposed for display on the waveform editing screen 20.

In the waveform view area 24, an analog waveform generated in a page of analog.01.sig and digital signal waveforms generated in a page of dgt.01.sig based on binary signals obtained by digital bit resolution of the values of each point of the analog waveform are superimposed for display. In the coordinate data view area 23, coordinate data of the points of the analog waveform generated in the analog.01.sig page is shown.

When the analog waveform in the waveform view area 24 or the coordinate data in the coordinate data view area 23 is edited by the above method, the edit processing of the digital waveforms is also performed in response to the editing. And the number of channels of digital signals is also altered in response to the maximum value of the coordinate data of the analog waveform. When the digital signal waveforms generated in the dgt.01.sig page are selected by a selection of a page tab and the digital signal waveforms or the coordinate data thereof in the coordinate data view area 23 is edited, the edit processing of the analog waveform is also performed in response to the editing. The waveform editing is performed so that the analog waveform and the digital signal waveforms are corresponding to each other on every occasion.

Figure 16:
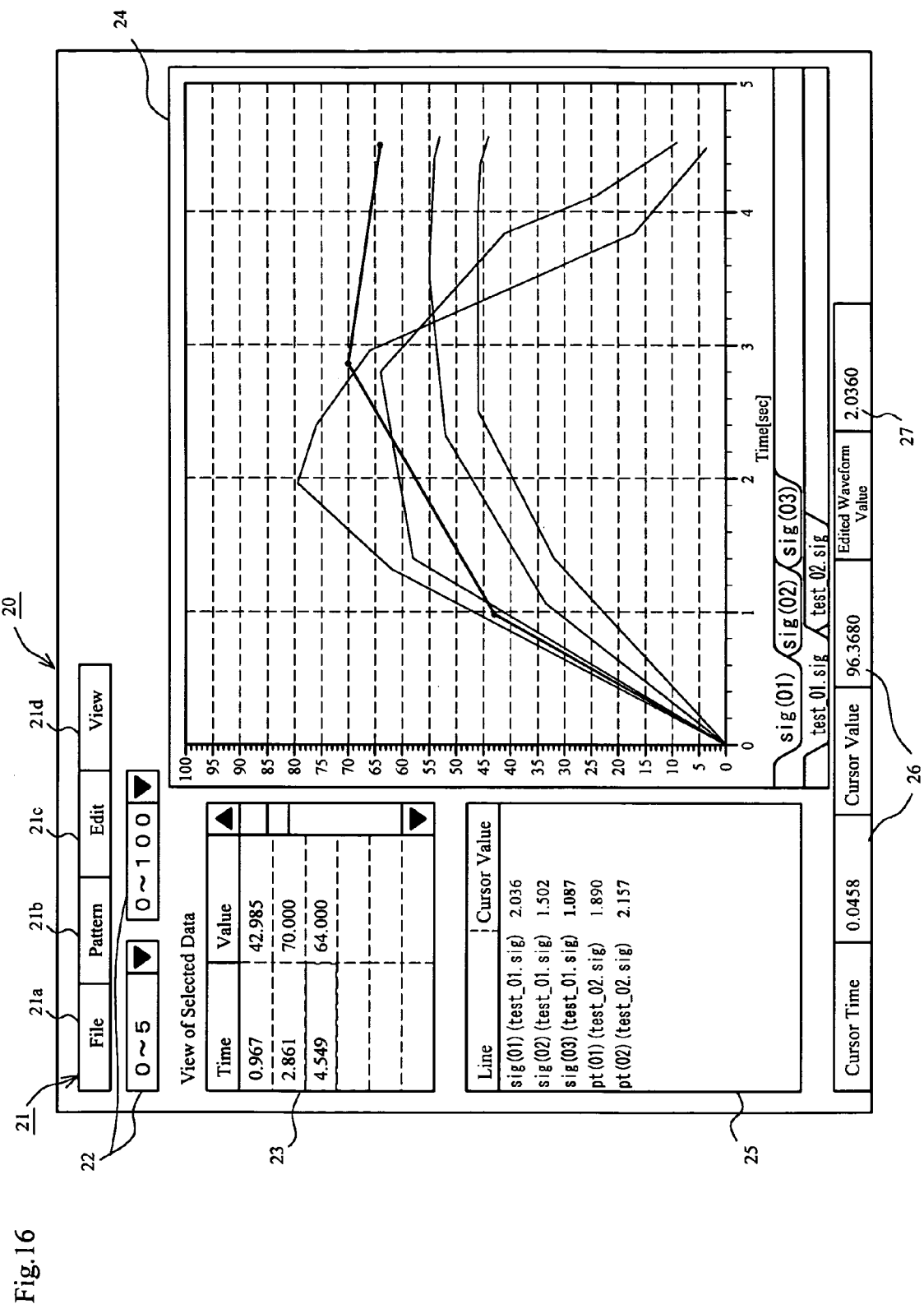
FIG. 16 is a diagram showing an example of a screen display of the waveform editing screen when a file with data of multiple analog waveforms stored therein is opened.

FIG. 16 is a diagram showing an example of a screen display when multiple analog waveforms are superimposed for display on the waveform editing screen 20.

On the waveform editing screen 20, it is possible to group the waveform data prepared in each page and store it in a file. In a waveform display, not only an analog waveform in a selected page is shown, but also analog waveforms in other unselected pages are superimposed for display on the same coordinate axes. It is also possible to open multiple files at the same time, so that it is also possible to show waveforms stored in these multiple files at the sane time.

FIG. 16 shows the state of the display wherein a file (test.01.sig) with three pages of waveform data (Sig(01), Sig(02) and Sig(03)) stored therein and a file (test.02.sig) with two pages of waveform data (pt(01) and pt(02)) stored therein are opened.

In the waveform view area 24, five waveforms stored in the files (test.01.sig and test.02.sig) are superimposed for display on the same value axis and time axis. In FIG. 16, the waveform generated in the Sig(01) page of the file (test.01.sig) is selected. Points constituting the waveform of Sig(01) are marked with coordinate marks (black dot marks) and the waveform is drawn with a full line thicker than the other waveforms, being a line of a different kind, in order to differentiate the waveform from the others.

In the coordinate data view area 23, coordinate data (time and value) corresponding to the points constituting the selected analog waveform of Sig(01) of the file (test.01.sig) is shown.

In the waveform data view area 25, the names of waveforms and files shown in the waveform view area 24, and the value (cursor value) at a time where the cursor 28 is located are shown. In order to make the correspondence between the analog waveforms shown in the waveform view area 24 and the waveform names and file names shown in the waveform data view area 25 known at a glance, each waveform and its corresponding waveform name and file name are displayed in the same color. The color arrangement can be programmed by the user.

Figure 17:
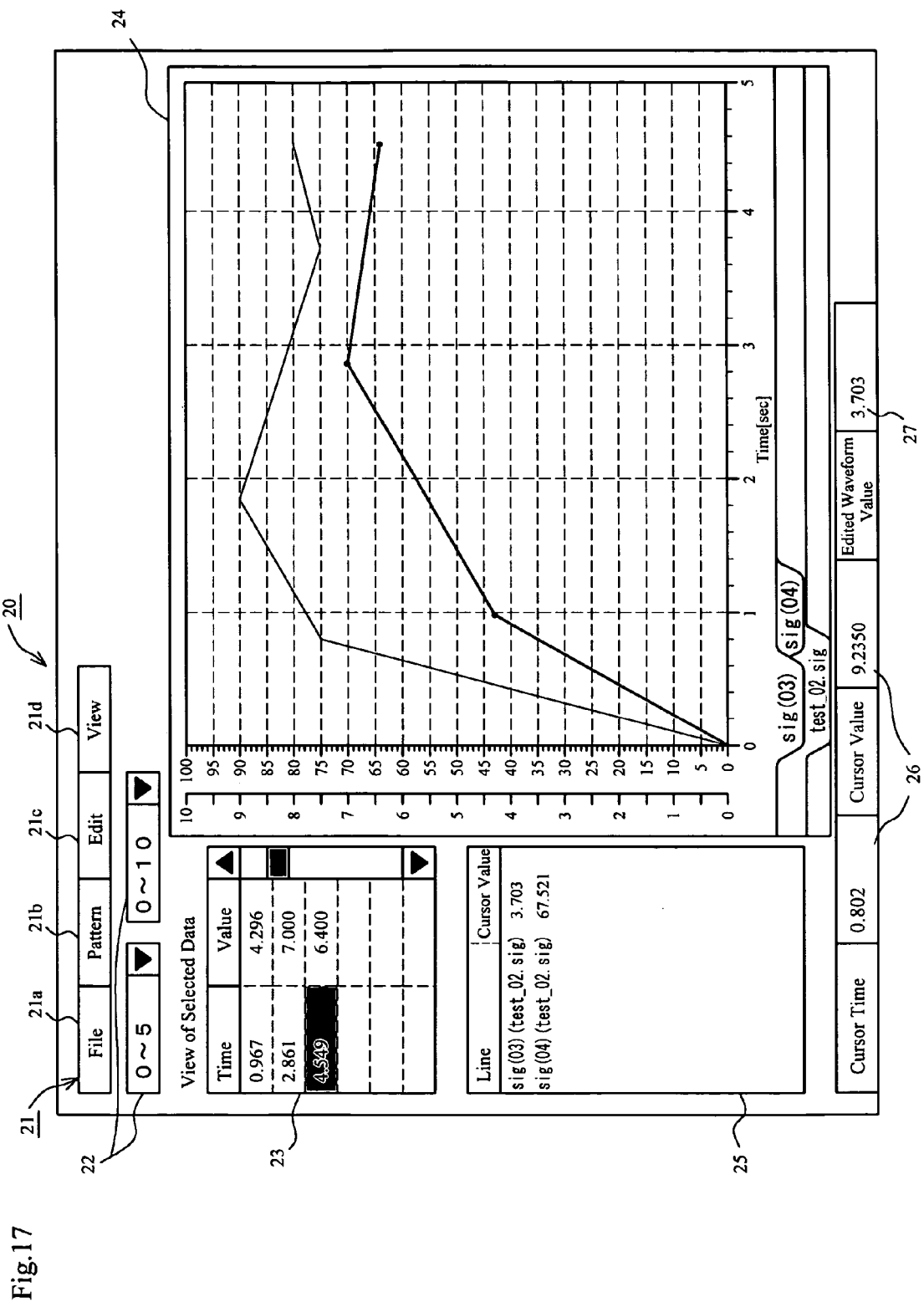
FIG. 17 is a diagram showing another example of a screen display of the waveform editing screen when a file with data of multiple analog waveforms stored therein is opened.

When waveforms having ranges of the value axis greatly different from one another are shown on the same value axis as shown in FIG. 16, it becomes difficult to grasp the shape of a waveform having small values. Therefore, when the maximum values of multiple waveforms on the value axis are different by a prescribed value or more, only the time axes of the multiple waveforms made identical with one another as shown in FIG. 17, and value axes of multiple scales are arranged for display of multiple analog waveforms so that each waveform can be shown in an appropriate size.

The waveform edit processing operations performed by the microcomputer 12 in the simulator 10 in which the waveform editing system according to the embodiment is adopted are descried below by reference to flow charts shown in FIGS. 18–27. Here, the waveform edit processing after displaying the waveform editing screen 20 is described.

Figure 18:
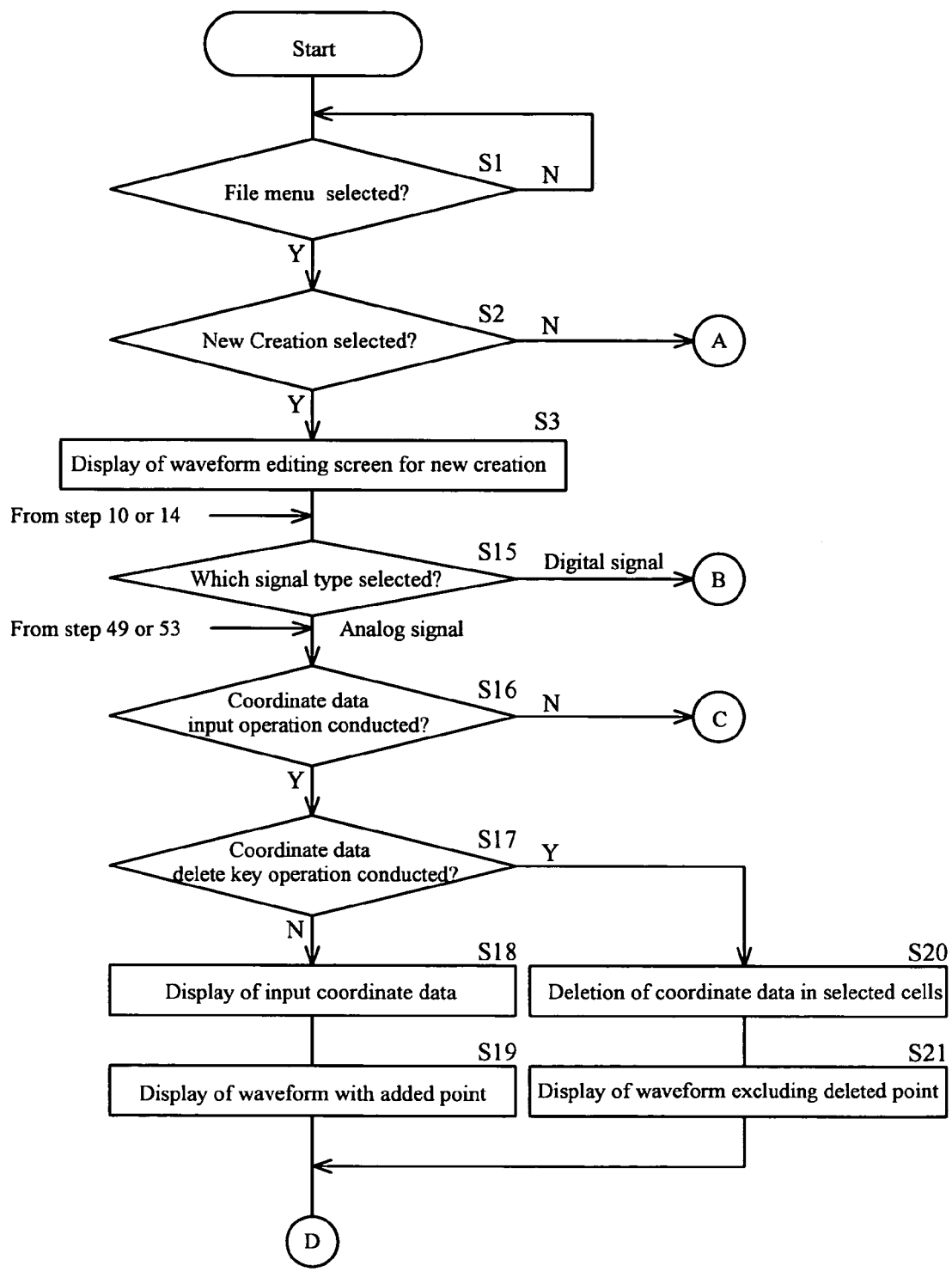
FIG. 18 is a flow chart showing waveform edit processing operations performed by a microcomputer of the simulator in which the waveform editing system according to the embodiment is adopted.

In Step 1 shown in FIG. 18, whether the File menu 21*a* in the menu section 21 was selected or not is judged. When the File menu 21*a* is judged not to have been selected, the processing returns to Step 1, while it goes to Step 2 when the File menu 21*a* is judged to have been selected.

In Step 2, whether New Creation was selected or not is judged. When New Creation is judged to have been selected, it goes to Step 3. In Step 3, the processing of displaying the waveform editing screen 20 for new creation is conducted, and then, it goes to Step 15.

Figure 19:
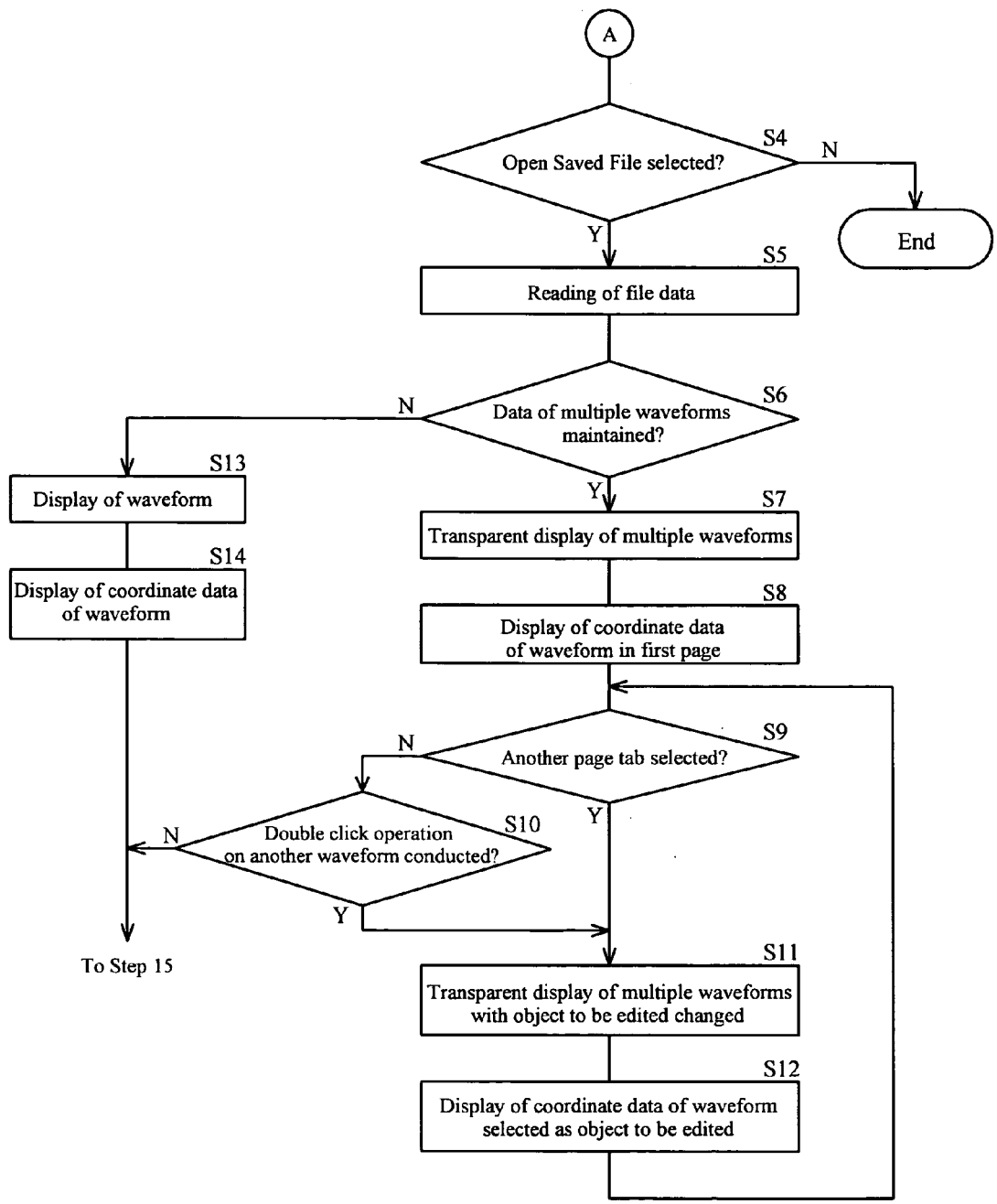
FIG. 19 is a flow chart showing waveform edit processing operations performed by the microcomputer of the simulator in which the waveform editing system according to the embodiment is adopted.

On the other hand, when New Creation is judged not to have been selected in Step 2, it goes to Step 4 shown in FIG. 19. In Step 4, whether Open Saved File was selected or not is judged. When Open Saved File is judged not to have been selected, the processing is ended, while it goes to Step 5 when Open Saved File is judged to have been selected.

In Step 5, waveform data (such as coordinate data) maintained in a selected file is read, and it goes to Step 6. In Step 6, whether data of multiple waveforms is grouped and maintained in the file or not is judged. When it is judged that data of multiple waveforms is grouped and maintained in the file, it goes to Step 7.

In Step 7, the transparent display processing of multiple waveforms for superimposing the multiple waveforms maintained in the file on the same coordinate axes for display in the waveform view area 24 is performed, and then, it goes to Step 8. Here, in cases where a waveform stored in the first page of the file is an analog waveform, points constituting the analog waveform are marked with coordinate marks as shown in FIG. 16.

In cases where the waveforms are analog waveforms and the maximum values of the multiple waveforms on the value axis are different by a prescribed value or more, only the time axes of the multiple waveforms are made identical with one another as shown in FIG. 17, and value axes of multiple scales are arranged for superimposing the multiple waveforms for display so that each waveform can be shown in an appropriate size.

In Step 8, the coordinate data of the points constituting the waveform stored in the first page is shown in the coordinate data view area 23, and then, it goes to Step 9. In Step 9, whether another page tab was selected or not is judged. When another page tab is judged to have been selected, it goes to Step 11, while it goes to Step 10 when another page tab is judged not to have been selected. In Step 10, whether a double click operation with the cursor 28 located on a currently unselected waveform was conducted or not is judged. When a double click operation is judged to have been conducted, it goes to Step 11, while it goes to Step 15 shown in FIG. 18 when a double click operation is judged not to have been conducted.

In Step 11, the waveform to be edited is changed to the waveform selected by the page tab selection or the waveform selected with the double click operation, and the transparent display processing of multiple waveforms for superimposing the multiple waveforms on the same coordinate axes for display in the waveform view area 24 is performed, and then, it goes to Step 12. Here, in cases where the selected waveform is an analog waveform, points constituting the waveform are marked with coordinate marks, similarly to the processing in Step 7. And in cases where the waveforms are analog waveforms and the maximum values of the multiple waveforms on the value axis are different by a prescribed value or more, only the time axes of the multiple waveforms are made identical with one another, and value axes of multiple scales are arranged for displaying the multiple waveforms so that each waveform can be shown in an appropriate size. In Step 12, the coordinate data of the points constituting the waveform selected as an object to be edited is shown in the coordinate data view area 23, and then it returns to Step 9.

On the other hand, in Step 6, when it is judged that data of multiple waveforms is not grouped for storage in the file, or that data of only one waveform is maintained in the file, it goes to Step 13.

In Step 13, the waveform maintained in the file is shown in the waveform view area 24, and then, it goes to Step 14. Here, in cases where the waveform is an analog waveform, points constituting the analog waveform are marked with coordinate marks. In Step 14, the coordinate data of the points constituting the waveform is shown in the coordinate data view area 23, and then it goes to Step 15 shown in FIG. 18.

In Step 15, the selected signal type, or which of analog signals and digital signals are selected as signals of a generated waveform is judged. When analog signals are judged as being selected, it goes to Step 16. In Step 16, whether an input operation of coordinate data to the coordinate data view area 23 was conducted or not is judged.

When an input operation of coordinate data to the coordinate data view area 23 is judged to have been conducted, it goes to Step 17. In Step 17, whether an operation of a coordinate data delete key for deleting the coordinate data input to cells in the coordinate data view area 23 was conducted or not is judged. When it is judged that an operation of the coordinate data delete key was not conducted, or that the coordinate data was input, it goes to Step 18.

In Step 18, the input coordinate data is displayed in the coordinate data view area 23, and then, it goes to Step 19. In Step 19, an analog waveform wherein a point is added to a coordinate position corresponding to the input coordinate data is displayed in the waveform view area 24, and then, it goes to Step 49 shown in FIG. 22.

On the other hand, in Step 17, when an operation of the coordinate data delete key is judged to have been conducted, it goes to Step 20. In Step 20, the coordinate data shown in the selected cells is deleted, and it goes to Step 21. In Step 21, an analog waveform wherein a point corresponding to the deleted coordinate data is excluded is generated for display in the waveform view area 24, and then, it goes to Step 49 shown in FIG. 22.

Figure 20:
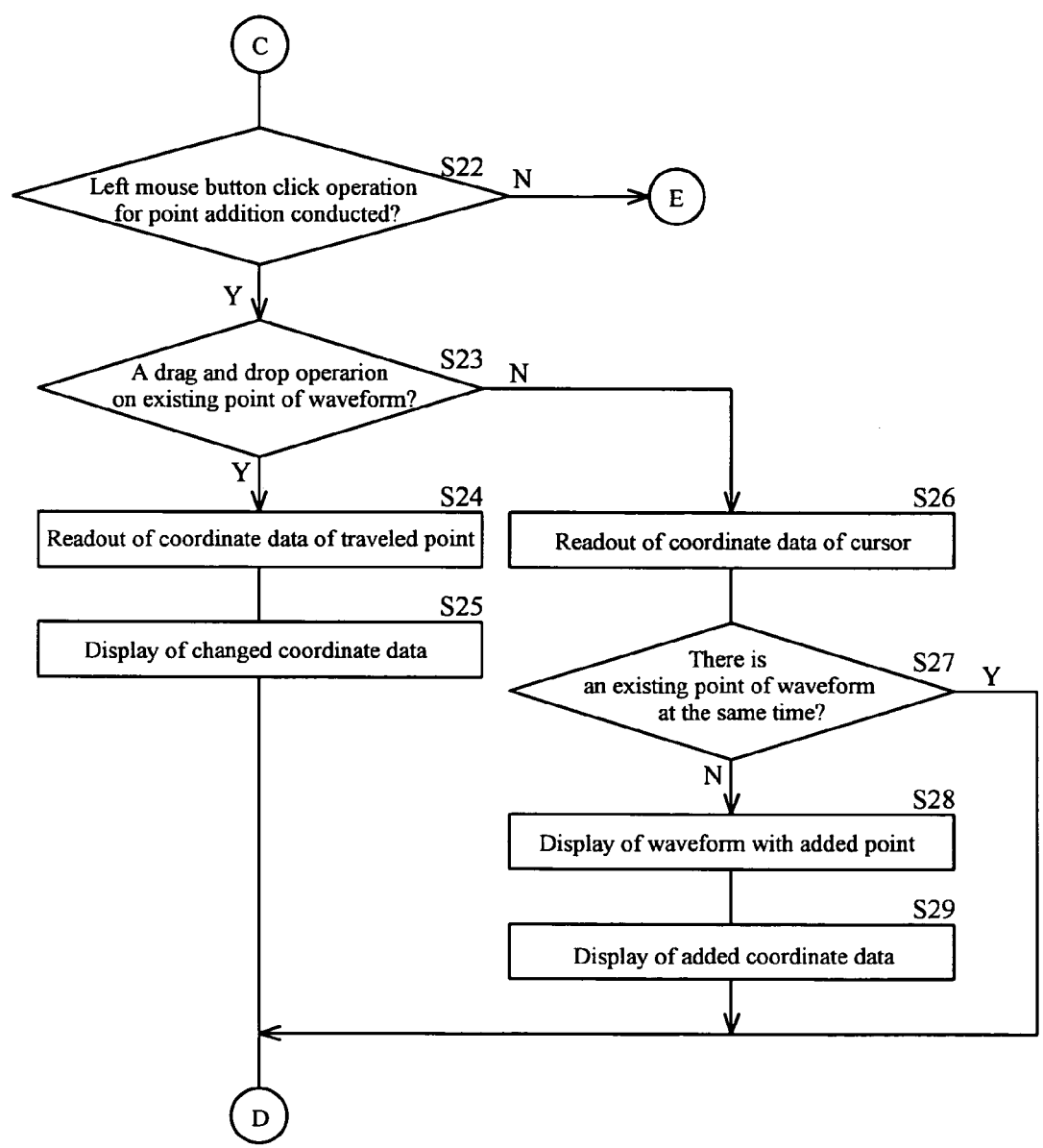
FIG. 20 is a flow chart showing waveform edit processing operations performed by the microcomputer of the simulator in which the waveform editing system according to the embodiment is adopted.

On the other hand, in Step 16, when an input operation to the coordinate data view area 23 is judged not to have been conducted, it goes to Step 22 shown in FIG. 20. In Step 22, whether a left mouse button click operation with the cursor 28 located at a prescribed place in the waveform view area 24 for point addition was conducted or not is judged. When a left mouse button click operation is judged to have been conducted, it goes to Step 23.

In Step 23, whether the left mouse button click operation is a drag and drop operation on an existing point of the waveform or not is judged. When it is judged as being a drag and drop operation, it goes to Step 24. In Step 24, the coordinate data of the traveled point by the drag and drop operation is read, and it goes to Step 25. In Step 25, the coordinate data in the coordinate data view area 23 is changed to the coordinate data of the point after movement for display, and then, it goes to Step 49 shown in FIG. 22.

On the other hand, in Step 23, when it is judged as not being a drag and drop operation on an existing point of the waveform, it goes to Step 26. In Step 26, the coordinate data of the cursor 28 is read, and it goes to Step 27. In Step 27, whether there is an existing point of the waveform at the same time or not is judged. When it is judged that there is not an existing point of the waveform, it goes to Step 28. In Step 28, the display processing of an analog waveform with the added point marked with a coordinate mark is conducted, and then, it goes to Step 29.

Figure 22:
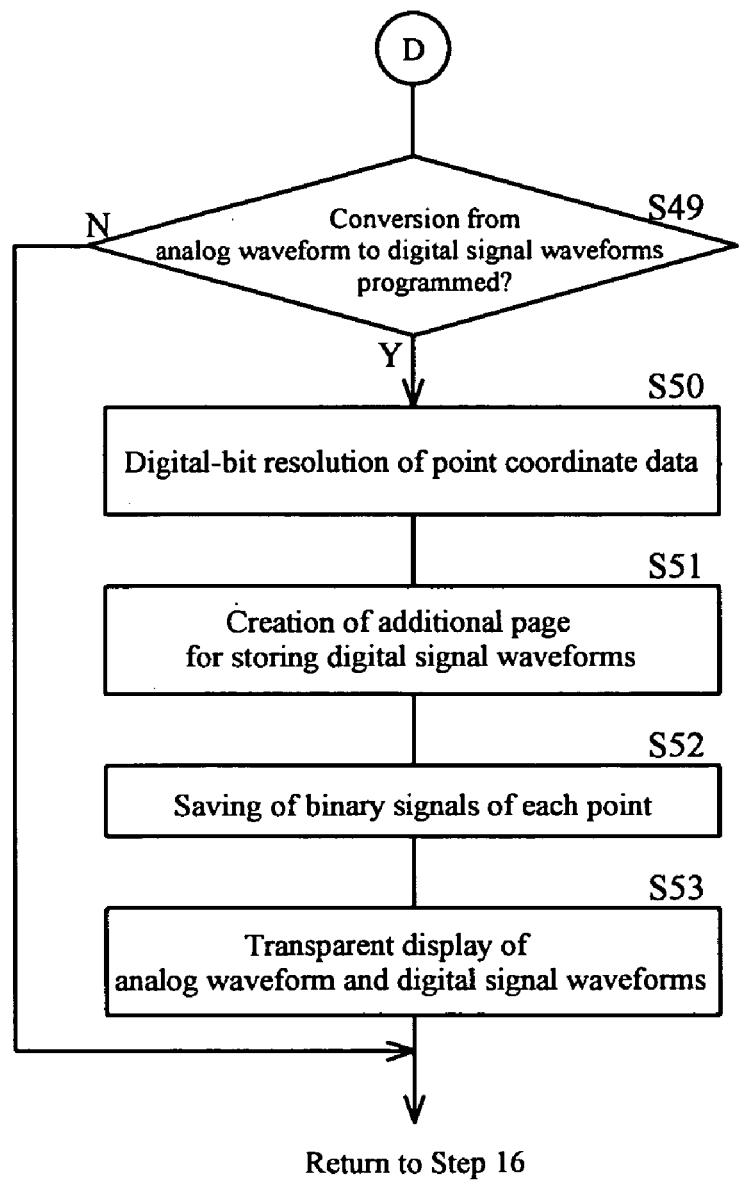
FIG. 22 is a flow chart showing waveform edit processing operations performed by the microcomputer of the simulator in which the waveform editing system according to the embodiment is adopted.

In Step 29, the coordinate data corresponding to the added point is added to the coordinate data view area 23 for display, and then, it goes to Step 49 shown in FIG. 22. On the other hand, in Step 27, when it is judged that there is an existing point of the waveform at the same time, it goes to Step 49 shown in FIG. 22.

Figure 21:
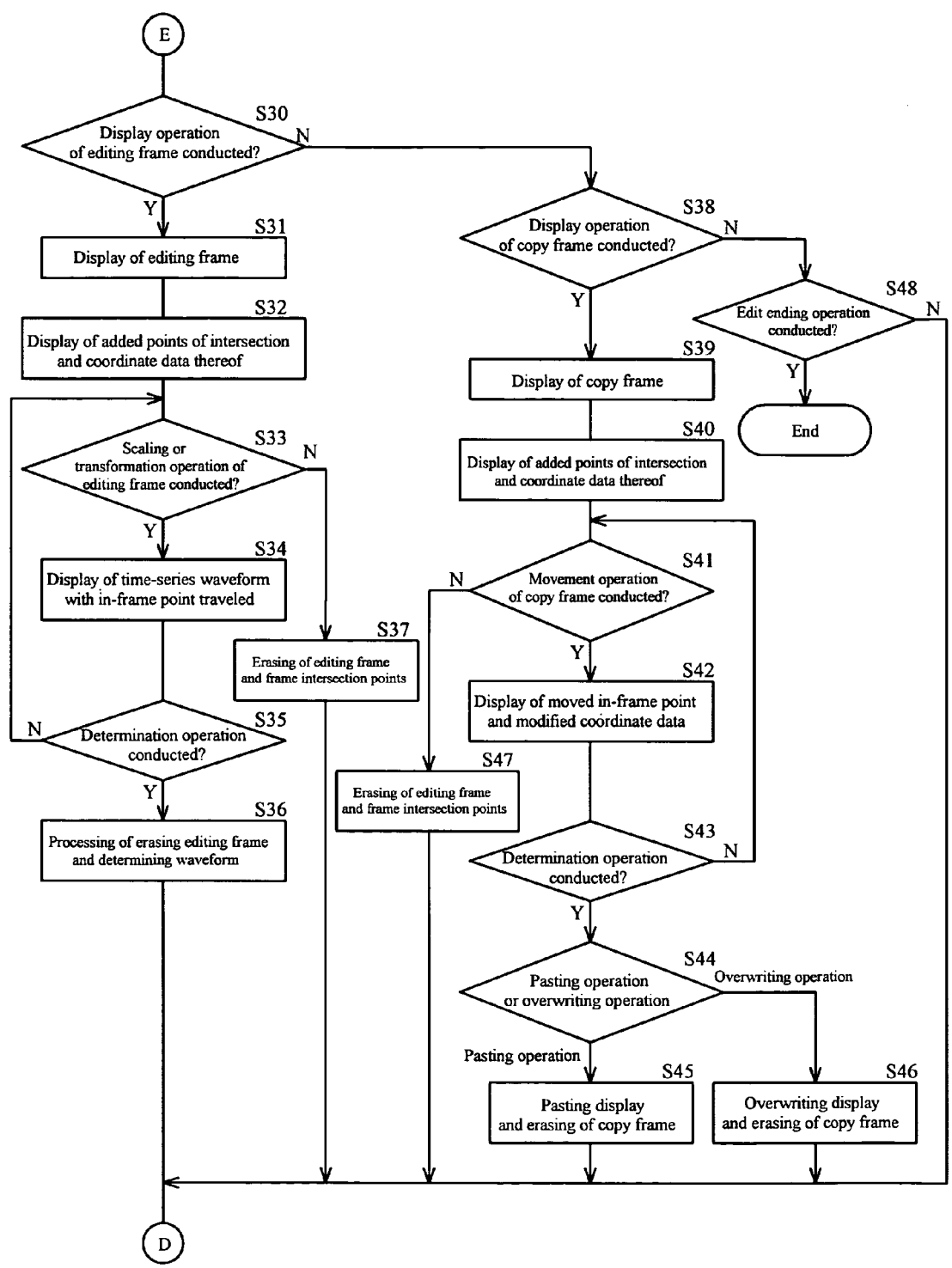
FIG. 21 is a flow chart showing waveform edit processing operations performed by the microcomputer of the simulator in which the waveform editing system according to the embodiment is adopted.

On the other hand, in Step 22, when a left mouse button click operation for point addition is judged not to have been conducted, it goes to Step 30 shown in FIG. 21. In Step 30, whether a display operation of the editing frame 31 was conducted or not is judged. When a display operation of the editing frame 31 is judged to have been conducted, it goes to Step 31. In Step 31, the editing frame 31 is shown at a position designated by the cursor 28 or the like, and then, it goes to Step 32.

In Step 32, as points of intersection of the editing frame 31 and the analog waveform are added and displayed as points constituting the waveform, the coordinate data corresponding to the points is added and displayed in the coordinate data view area 23, and then, it goes to Step 33. In Step 33, whether a scaling or transformation operation of the editing frame 31 was conducted or not is judged. When a scaling or transformation operation of the editing frame 31 is judged to have been conducted, it goes to Step 34. In Step 34, with the positional relation between the editing frame 31 and the in-frame point held, the editing frame 31 and the in-frame point are moved according to the amount of scaling or transformation, and a time-series waveform is generated from the traveled in-frame point and other points for display. And the coordinate data of the traveled point is modified and displayed in the coordinate data view area 23, and then, it goes to Step 35.

In Step 35, whether a determination operation such as a double click operation was conducted or not is judged. When a determination operation is judged not to have been conducted, it returns to Step 33, while it goes to Step 36 when a determination operation is judged to have been conducted. In Step 36, the editing frame 31 is erased and the waveform is determined, and then, it goes to Step 49 shown in FIG. 22.

On the other hand, in Step 33, when a scaling or transformation operation of the editing frame 31 is judged not to have been conducted, it goes to Step 37. In Step 37, the editing frame 31 and the points of the frame intersection are erased, and it goes to Step 49 shown in FIG. 22.

On the other hand, in Step 30, when a display operation of the editing frame 31 is judged not to have been conducted, it goes to Step 38. In Step 38, whether a display operation of the copy frame 32 was conducted or not is judged. When a display operation of the copy frame 32 is judged to have been conducted, it goes to Step 39. In Step 39, the copy frame 32 is displayed at a position designated by the cursor 28 or the like, and then, it goes to Step 40.

In Step 40, as points of intersection of the copy frame 32 and the analog waveform are added and displayed as points constituting the waveform, the coordinate data corresponding to the points is added and displayed in the coordinate data view area 23, and then, it goes to Step 41. In Step 41, whether an operation of moving the copy frame 32 with the in-frame point was conducted or not is judged. When an operation of moving the copy frame 32 is judged to have been conducted, it goes to Step 42.

In Step 42, as the copy frame 32 and the in-frame point are displayed at the positions to which they moved, the coordinate data of the moved point is modified and displayed in the coordinate data view area 23, and then, it goes to Step 43.

In Step 43, whether a determination operation such as a double click operation was conducted or not is judged. When a determination operation is judged not to have been conducted, it returns to Step 41, while it goes to Step 44 when a determination operation is judged to have been conducted. In Step 44, whether it is a pasting operation or an overwriting operation is judged. When it is judged as being a pasting operation, it goes to Step 45. In Step 45, in cases where there is an existing point within the copy frame 32, the pasting display processing of generating a time-series waveform from the existing point and the copied point for display and the processing of erasing the copy frame 32 are conducted, and then, it goes to Step 49 shown in FIG. 22.

In Step 44, when it is judged as being an overwriting operation, it goes to Step 46. In Step 46, in cases where there is an existing point within the copy frame 32, the overwriting display processing of discarding the existing point and generating a time-series waveform from the copied point and existing points existent outside the copy frame 32 for display and the processing of erasing the copy frame 32 are conducted, and then, it goes to Step 49 shown in FIG. 22.

On the other hand, in Step 41, when an operation of moving the copy frame 32 is judged not to have been conducted, it goes to Step 47. In Step 47, the copy frame 32 and the points of the frame intersection are erased, and it goes to Step 49 shown in FIG. 22.

On the other hand, when a display operation of the copy frame 32 is judged not to have been conducted in Step 38, it goes to Step 48. In Step 48, whether an edit ending operation was conducted or not is judged. When an edit ending operation is judged to have been conducted, the processing is ended, while it goes to Step 49 shown in FIG. 22 when an edit ending operation is judged not to have been conducted.

In Step 49 shown in FIG. 22, whether a conversion from an analog waveform to digital signal waveforms is programmed or not is judged. When a conversion from an analog waveform to digital signal waveforms is judged not to be programmed, it returns to Step 16, while it goes to Step 50 when a conversion is judged to be programmed.

In Step 50, the digital bit resolution of the coordinate data of each point of the analog waveform into binary signals of a prescribed number of channels is conducted, and then, it goes to Step 51. In Step 51, an additional page for storing the digital signal waveforms is created in the currently opened file, and then, it goes to Step 52.

In Step 52, the binary signals of each point obtained by the digital bit resolution are saved, and then, it goes to Step 53. In Step 53, the transparent display processing wherein digital signal waveforms generated based on the binary signals and an analog waveform are superimposed for display on the same time axis is performed, and then, it returns to Step 16.

Figure 23:
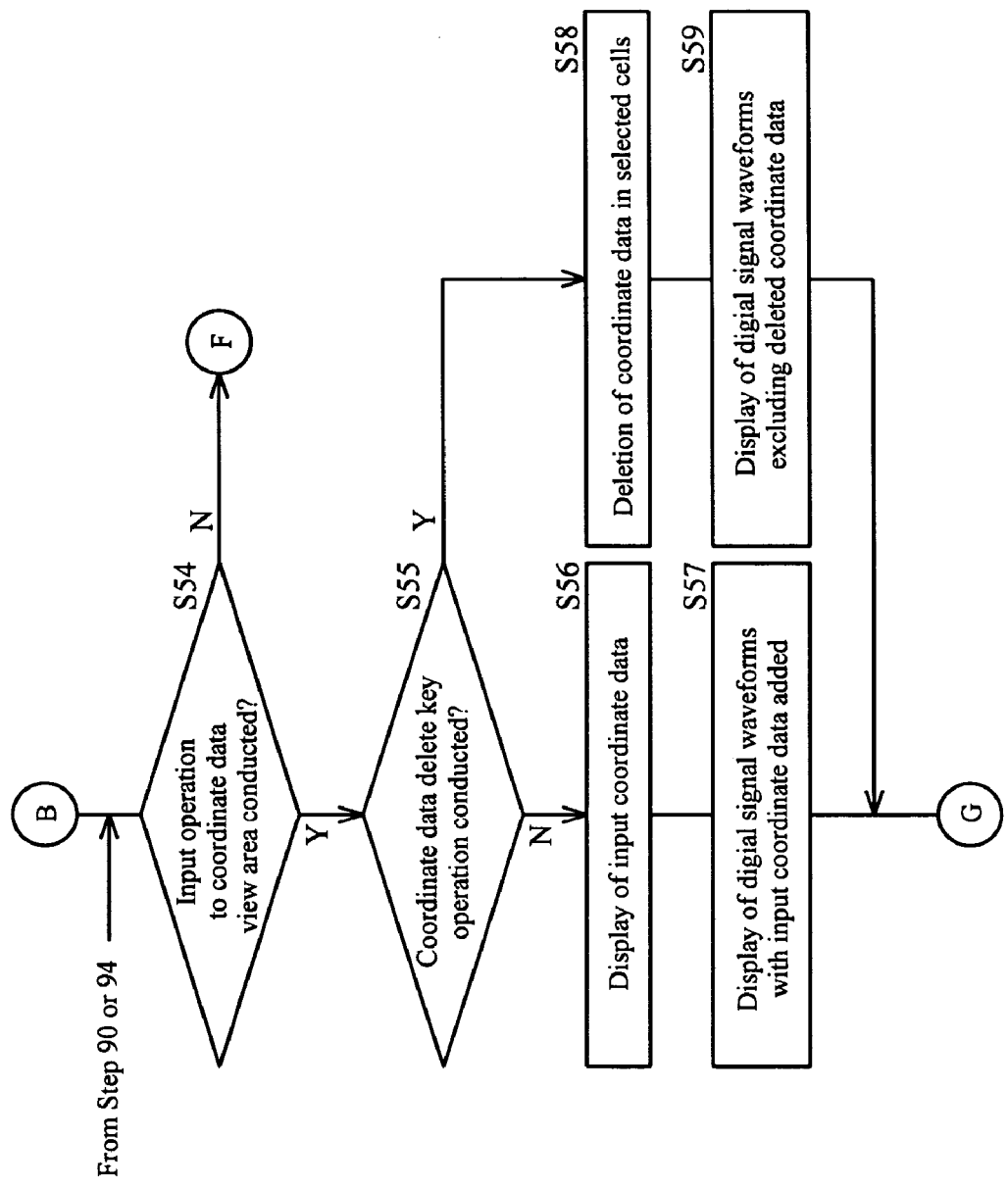
FIG. 23 is a flow chart showing waveform edit processing operations performed by the microcomputer of the simulator in which the waveform editing system according to the embodiment is adopted.

On the other hand, when the selected signal type is judged as being a digital signal in Step 15 shown in FIG. 18, it goes to Step 54 shown in FIG. 23. In Step 54, whether an input operation of coordinate data to the coordinate data view area 23 was conducted or not is judged. When an input operation of coordinate data is judged to have been conducted, it goes to Step 55.

In Step 55, whether a coordinate data delete key operation for deleting the coordinate data (time and value (binary code, hexadecimal code, etc.)) shown in the cells of the coordinate data view area 23 was conducted or not is judged. When it is judged that a coordinate data delete key operation was not conducted, or that the coordinate data was additionally input, it goes to Step 56.

In Step 56, the input coordinate data, or the time value and the value (binary code, hexadecimal code, etc.) are displayed in the coordinate data view area 23, and then, it goes to Step 57. In Step 57, digital signal waveforms with the input coordinate data added thereto are regenerated and displayed in the waveform view area 24, and then, it goes to Step 90 shown in FIG. 26.

On the other hand, when a coordinate data delete key operation is judged to have been conducted in Step 55, it goes to Step 58, wherein the coordinate data shown in the selected cells is deleted, and then, it goes to Step 59. In Step 59, digital signal waveforms excluding the deleted coordinate data are regenerated for display, and then, it goes to Step 90 shown in FIG. 26.

Figure 24:
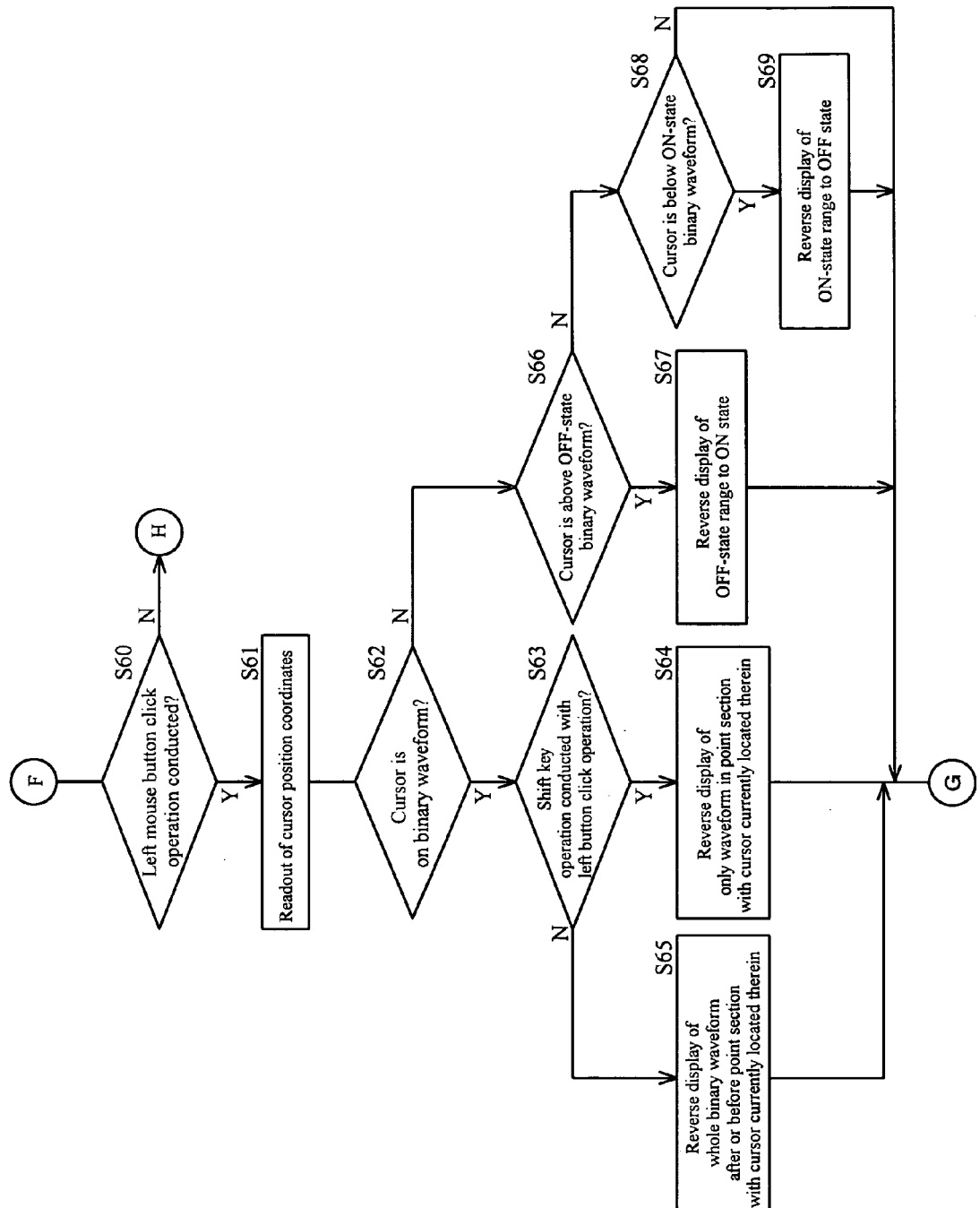
FIG. 24 is a flow chart showing waveform edit processing operations performed by the microcomputer of he simulator in which the waveform editing system according to the embodiment is adopted.

On the other hand, when an input operation of coordinate data to the coordinate data view area 23 is judged not to have been conducted in Step 54, it goes to Step 60 shown in FIG. 24. In Step 60, whether a left mouse button click operation was conducted or not is judged. When a left mouse button click operation is judged to have been conducted, it goes to Step 61. In Step 61, the position coordinates of the cursor 28 are read out, and it goes to Step 62.

In Step 62, whether the cursor 28 is located on a binary waveform or not is judged. When the cursor 28 is judged to be located on a binary waveform, it goes to Step 63. In Step 63, whether a keyboard shift key operation was conducted with a left mouse button click operation or not is judged. When a shift key operation is judged to have been conducted, it goes to Step 64. In Step 64, only the waveform in the point section of the binary waveform wherein the cursor 28 is located is reversed for display, and then, it goes to Step 90 shown in FIG. 26.

On the other hand, when a shift key operation is judged not to have been conducted with a left mouse button click operation in Step 63, it goes to Step 65. In Step 65, the whole binary waveform after or before the point section of the binary waveform wherein the cursor 28 is located is reversed for display, and then, it goes to Step 90 shown in FIG. 26.

On the other hand, when the cursor 28 is judged not to be located on a binary waveform in Step 62, it goes to Step 66, wherein whether the cursor 28 is located above an OFF-state binary waveform or not is judged. When the cursor 28 is judged to be located above an OFF-state binary waveform, it goes to Step 67. In Step 67, the OFF-state region is reversed to the ON state for display, and then, it goes to Step 90 shown in FIG. 26.

On the other hand, when the cursor 28 is judged not to be located above an OFF-state binary waveform in Step 66, it goes to Step 68. In Step 68, whether the cursor 28 is located below an ON-state binary waveform or not is judged. When the cursor 28 is judged to be located below an ON-state binary waveform, it goes to Step 69. In Step 69, the ON-state region is reversed to the OFF state for display, and then, it goes to Step 90 shown in FIG. 26. On the other hand, in Step 68, when the cursor 28 is judged not to be located below an ON-state binary waveform, it goes to Step 90 shown in FIG. 26.

Figure 25:
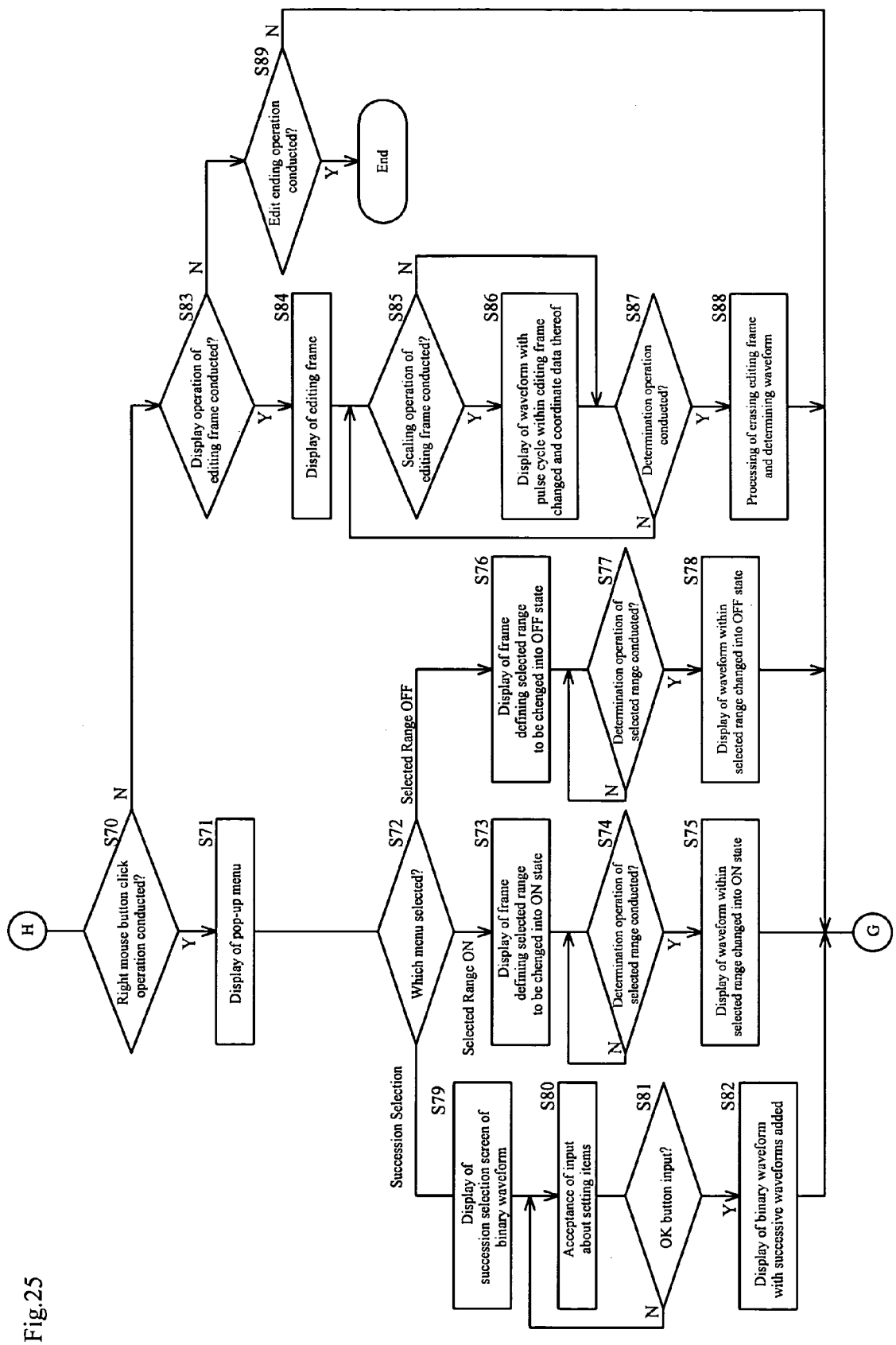
FIG. 25 is a flow chart showing waveform edit processing operations performed by the microcomputer of the simulator wherein the waveform editing system according to the embodiment is adopted.

On the other hand, when a left mouse button click operation is judged not to have been conducted in Step 60, it goes to Step 70 shown in FIG. 25. In Step 70, whether a right mouse button click operation was conducted or not is judged. When a right mouse button click operation is judged to have been conducted, it goes to Step 71. In Step 71, a pop-up menu is displayed, and it goes to Step 72.

In Step 72, which menu is selected is judged. When Selected Range ON is judged to have been selected, it goes to Step 73, wherein a frame defining the selected range in which the binary waveform is changed into the ON state is displayed, and then, it goes to Step 74.

In Step 74, whether an operation of determining the selected range with the frame, such as a double click operation was conducted or not is judged. When a selected range determination operation is judged to have been conducted, it goes to Step 75. In Step 75, the binary waveform within the selected range with the frame is changed into the ON state for display, and then, it goes to Step 90 shown in FIG. 26. On the other hand, when a selected range determination operation is judged not to have been conducted in Step 74, it returns to Step 74.

On the other hand, when Selected Range OFF is judged to have been selected in Step 72, it goes to Step 76. In Step 76, a frame defining the selected range in which the binary waveform is changed into the OFF state is displayed, and then, it goes to Step 77. In Step 77, whether an operation of determining the selected range with the frame was conducted or not is judged. When a selected range determination operation is judged to have been conducted, it goes to Step 78. In Step 78, the binary waveform within the selected range with the frame is changed into the OFF state for display, and then, it goes to Step 90 shown in FIG. 26. On the other hand, when a selected range determination operation is judged not to have been conducted in Step 77, it returns to Step 77.

On the other hand, when Succession Selection is judged to have been selected in Step 72, it goes to Step 79. In Step 79, the succession selection screen of a binary waveform shown in FIG. 11 is displayed, and then, it goes to Step 80.

In Step 80, input about each of setting items on the selection screen is accepted, and then, it goes to Step 81. In Step 81, whether the OK button for showing the completion of inputting selections was input or not is judged. When the OK button is judged not to have been input, it returns to Step 80, while it goes to Step 82 when the OK button is judged to have been input.

Figure 26:
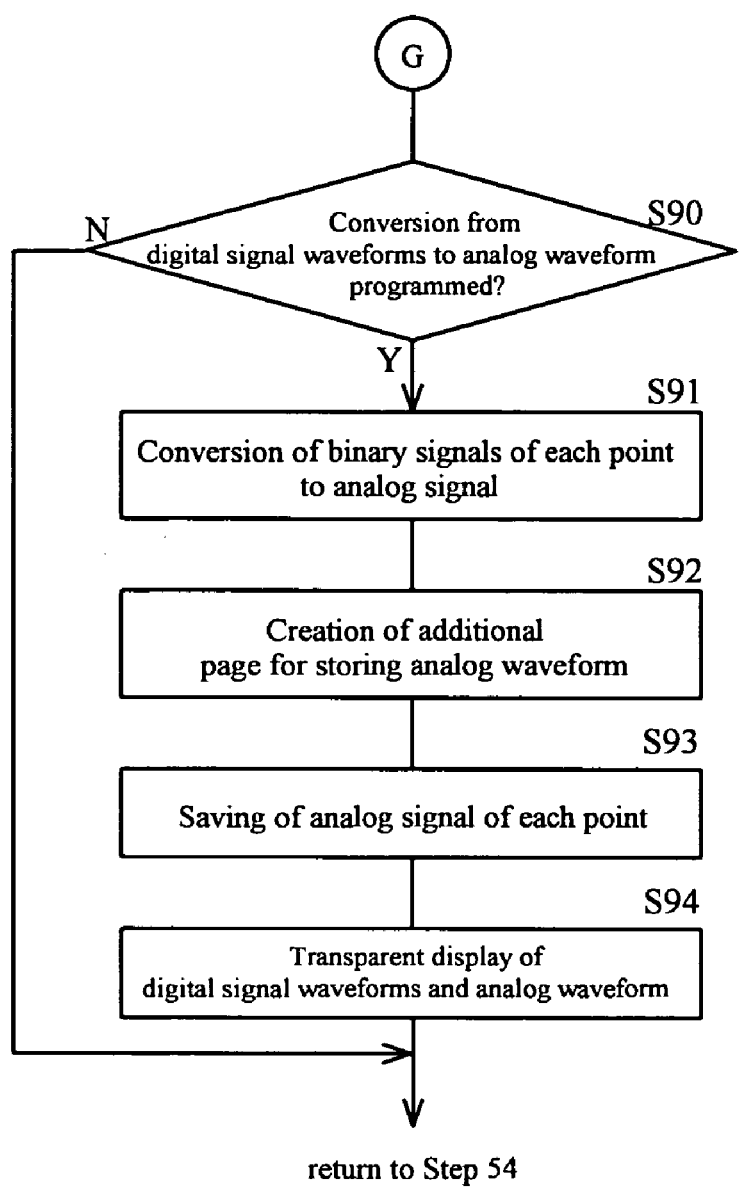
FIG. 26 is a flow chart showing waveform edit processing operations performed by the microcomputer of the simulator in which the waveform editing system according to the embodiment is adopted.

In Step 82, successive short-type waves generated based on the selected conditions on the selection screen are added to a binary waveform, and then, it goes to Step 90 shown in FIG. 26.

On the other hand, when a right mouse button click operation is judged not to have been conducted in Step 70, it goes to Step 83. In Step 83, whether a display operation of the editing frame 31a for editing a binary waveform was conducted or not is judged. When a display operation of the editing frame 31a is judged to have been conducted, it goes to Step 84. In Step 84, the editing frame 31a is displayed at a place designated by the cursor 28 or the like, and then, it goes to Step 85.

In Step 85, whether a scaling operation (enlarging or reducing operation) of the editing frame 31a was conducted or not is judged. When a scaling operation of the editing frame 31a is judged to have been conducted, it goes to Step 86, while it goes to Step 87 when a scaling operation of the editing frame 31a is judged not to have been conducted.

In Step 86, a binary waveform with a pulse cycle in the editing frame 31a changed according to the amount of scaling of the editing frame 31a is generated for display, and the coordinate data of the binary waveform with the pulse cycle changed is displayed in the coordinate data view area 23, and then, it goes to Step 87.

In Step 87, whether a determination operation such as a double click operation was conducted or not is judged. When a determination operation is judged not to have been conducted, it returns to Step 85, while it goes to Step 88 when a determination operation is judged to have been conducted. In Step 88, the editing frame 31a is erased and the binary waveform is determined, and then, it goes to Step 90 shown in FIG. 26.

On the other hand, when a display operation of the editing frame 31a is judged not to have been conducted in Step 83, it goes to Step 89. In Step 89, whether an edit ending operation was conducted or not is judged. When an edit ending operation is judged to have been conducted, the processing is ended, while it goes to Step 90 shown in FIG. 26 when an edit ending operation is judged not to have been conducted.

In Step 90 shown in FIG. 26, whether a conversion from digital signal waveforms to an analog waveform is programmed or not is judged. When it is judged that a conversion from digital waveforms to an analog waveform is not programmed, it returns to Step 54, while it goes to Step 91 when it is judged that such conversion is programmed. In Step 91, binary signals of a prescribed number of channels of each point constituting digital signal waveforms are converted into analog signals, and then, it goes to Step 92.

In Step 92, a page for storing the analog waveform is created and added to the currently opened file, and then, it goes to Step 93. In Step 93, the analog signals of each point converted from the binary signals are saved, and then, it goes to Step 94. In Step 94, the transparent display processing wherein an analog waveform generated based on the obtained analog signals and the digital signal waveforms are superimposed on the same time axis for display is performed, and then, it returns to Step 54.

Using the simulator in which the waveform editing system according to the above embodiment is adopted, an analog waveform based on prescribed data and digital signal waveforms comprising binary waveforms of a prescribed number of channels (bits) generated based on the prescribed data can be superimposed for display on the same time axis as shown in FIG. 15. When analog signals expressible with the analog waveform are output with a conversion to digital signals of prescribed bit strings expressible with the binary waveforms, it is possible to visually grasp as digital signals showing what binary waveforms the analog signals of the analog waveform are output from each bit string.

In cases where data captured from an outside source is digital signals expressible with the binary waveforms, an analog waveform generated by converting the digital signals to analog signals can be superimposed over the binary waveforms, so that by making reference to coordinate data shown by the analog waveform, the binary waveforms can be edited more easily, resulting in enhanced efficiency in the editing.

On the waveform editing screen 20, the coordinate data view area 23 and the waveform view area 24 are displayed on the same screen. When a waveform shown in the waveform view area 24 is edited, coordinate data shown in the coordinate data view area 23 is modified and displayed. Therefore, the waveform can be edited in a state where the coordinate data of points of the waveform shown in the waveform view area 24 is shown in the coordinate data view area 23, so that it is possible to accurately locate a point of the waveform at a desired coordinate position, and the coordinate data of the waveform can be edited to accurate values, resulting in more accurate waveform editing.

It is possible to group and maintain coordinate data of multiple waveforms by the coordinate data maintaining function, so that the multiple waveforms maintained in the file can be displayed on the same time axis as shown in FIGS. 16 and 17 when the file is opened. As a result, comparisons of the multiple waveforms can be performed at a time. With a selection of a page tab or a selection of a waveform by the cursor designation, a desired waveform can be easily selected from among the multiple waveforms. Furthermore, it is possible to display the selected waveform with coordinate marks, a line of a different type, a line in a different color or the like in such a manner as to be easily distinguished from other waveforms.

Since coordinate data corresponding to points of a waveform is shown in the data input area 23, editing of the points to accurate coordinate positions can be conducted more easily. Particularly, when multiple waveforms are output with the same timing, it becomes possible to edit each waveform in a state where they are superimposed for display, resulting in enhanced efficiency in the editing of multiple waveforms.

In the editing of digital signal waveforms, since a binary signal determined by the position of the cursor 28 on the screen on which digital signal waveforms are shown is displayed in proximity to the cursor 28 as shown in FIG. 10, the user can grasp a binary signal at which the cursor 28 is located by making reference to the binary signal. As a result, it is possible to prevent improper editing operations of digital signal waveforms and to easily generate desired binary waveforms.

In the editing of digital signal waveforms, when an arbitrary point of a binary waveform shown in the waveform view area 24 is designated by the cursor 28, the whole binary waveform after or before the point section where the cursor 28 is located can be reversed for display, so that the reverse editing by one operation of the portion of the binary waveform after or before the designated point section can be easily conducted.

When a movement operation of the cursor 28 onto a binary waveform and a left mouse button click operation with the shift key pressed are detected, only the waveform in the point section where the cursor 28 is located is reversed for display, so that the partial editing of the binary waveform can be easily conducted.

With the positional relation between the editing frame 31 and a point within the editing frame 31 held, the point within the editing frame 31 can be moved according to the amount of scaling or transformation of the editing frame 31. Therefore, in cases where the editing with the positional relation in part of the analog waveform kept is desired, the partial editing of the analog waveform can be easily conducted. Even if the time sequence of the point within the editing frame 31 and other points is changed, a waveform wherein the point within the editing frame 31 and the other points are connected in chronological order is generated, so that it is possible to save the trouble of regenerating a time-series waveform later, resulting in efficient waveform editing.

By adding points of intersection of the editing frame 31 and an analog waveform designated by the editing frame 31 as new points in the editing frame 31, the editing area of the analog waveform can be easily defined by the editing frame 31, so that it becomes easy to perform an edit to a desired shape of a waveform by moving the portion of the waveform encircled by the editing frame 31 according to the amount of scaling or transformation.

And the analog waveform within the editing frame 32 can be copied. Therefore, in cases where part of the analog waveform is desired to be copied as it is, the partial editing of the analog waveform can be easily conducted. When another point exists within the copy frame 32 after Pasting is conducted, an analog waveform wherein the point within the copy frame 32 and the other points are connected in chronological order is generated, so that it is possible to save the trouble of regenerating a time-series waveform later, resulting in efficient waveform editing.

When another point exists within the copy frame 32 after Overwriting is conducted, an analog waveform with the anther point discarded is generated, so that it becomes possible to conduct the waveform editing with priority given to the waveform within the copy frame 32.

When a scaling operation of the editing frame 31a is detected in cases where the edited waveform is a binary waveform as shown in FIG. 13, the pulse cycle within the frame is changed according to the amount of scaling of the editing frame 31a, so that only the pulse cycle can be changed without changes in amplitude of the binary waveform, resulting in easy changing of the pulse cycle of the binary waveform.

Figure 27:
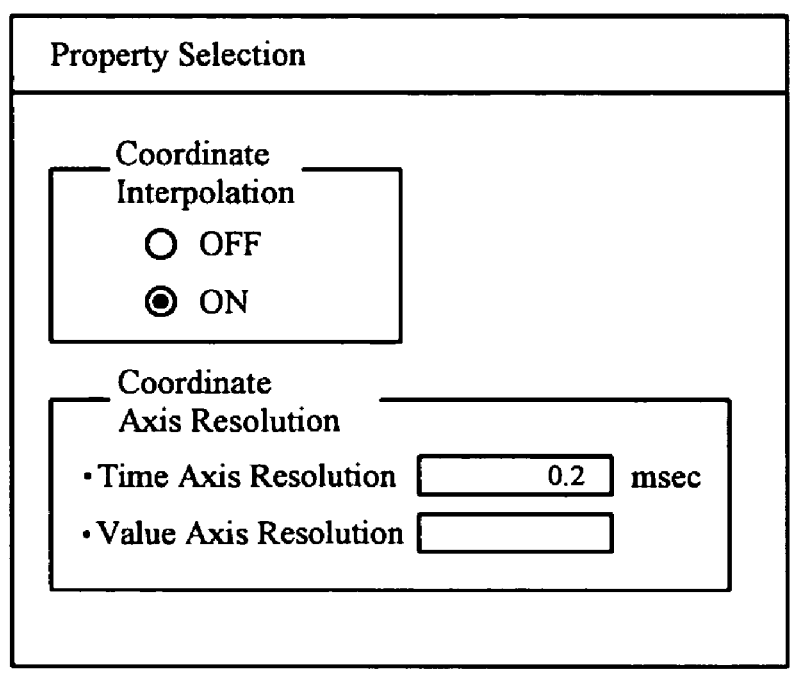
FIG. 27 is a diagram showing an example of a display on a property selection screen shown on a display of a waveform editing system according to another embodiment.

Using the simulator 10, there are some cases where the generated waveform signals are output at every time cycle (1 msec, 0.1 msec or the like) specified to the electronic control unit 15. In order to cope with the cases where the signals are output with a predetermined timing, in a waveform editing system according to another embodiment, coordinate data of a waveform can be acquired at a prescribed time cycle. When Property Selection in the Edit menu 21c is selected, the property selection screen shown in FIG. 27 is displayed. Through the property selection screen, the setting of OFF or ON of coordinate data acquisition, and the setting of the coordinate axis resolution units (time axis and value axis) of a waveform shown in the waveform view area 24 can be conducted.

When the output cycle is 0.2 msec, for example, through the property selection screen, the coordinate data acquisition is set ON, "0.2" msec is input to the input box of the time axis resolution unit and OK is selected for setting. When the time values of points added to the waveform view area 24 are 3.234 msec and 4.523 msec, the coordinate data of each at 3.2 msec and 4.6 msec is acquired, points corresponding to the acquired time values are shown, and the acquired time values can be also shown in the coordinate data view area 23. With regard to the values on the value axis, by setting an arbitrary value as the value axis resolution unit, the acquisition of coordinate data can be conducted similarly to the above.

Using the above waveform editing system, it is possible to arbitrarily set coordinate axis resolution units with consideration given to the output cycle of waveform signals and the like, and to acquire coordinate data effective on the output of waveform signals and the like in each coordinate axis resolution unit. As a result, the acquired coordinate data can be output with a predetermined timing, and a waveform with coordinates of a point fit for the output timing added thereto can be generated.

What is claimed is:

1. A waveform editing program stored on a computer-readable recording medium,
   the waveform editing program for allowing a waveform editing system, comprising at least a display device to display waveforms on a screen and an input device enabling input operations,
   which is able to display a waveform generated based on data input through the input device or data captured from an outside source on the screen, to implement:
   a first frame definition function of defining an editing area frame for editing the waveform;
   an in-frame point movement function of moving an in-frame point according to an amount of scaling or transformation of the editing area frame with a positional relation between the editing area frame and the in-frame point held when a scaling or transformation operation of the editing area frame defined by the first frame definition function is detected; and
   a first time-series waveform generation function of generating a time-series waveform from the in-frame point moved by the in-frame point movement function and other points of the waveform.

2. A waveform editing program according to claim 1, wherein:
   the in-frame point movement function is operable to add and move points of intersection of the editing area frame defined by the first frame definition function and the waveform as new in-frame points.

3. A waveform editing program stored on a computer-readable recording medium,
   the waveform editing program for allowing a waveform editing system, comprising at least a display device to display waveforms on a screen and an input device enabling input operations,
   which is able to display a waveform generated based on data input through the input device or data captured from an outside source on the screen, to implement:
   a second frame definition function of defining a copy area frame for copying the waveform;
   an in-frame waveform copy function of copying a waveform in the copy area frame defined by the second frame definition function; and
   a second time-series waveform generation function of generating a time-series waveform from an in-frame point and other points of the waveform when a location definition operation of the in-frame waveform copied by the in-frame waveform copy function is detected.

4. A waveform editing program according to claim 3, wherein:
   the second time-series waveform generation function is operable to generate a time-series waveform with an existing point discarded when the existing point is in the copy area frame after the location definition operation is performed.

5. A waveform editing program according to claim 3, wherein:
   the in-frame waveform copy function is operable to add and copy points of intersection of the copy area frame defined by the second frame definition function and the waveform as new in-frame points.

6. A waveform editing program stored on a computer-readable recording medium,
   the waveform editing program for allowing a waveform editing system, comprising at least a display device to display waveforms on a screen and an input device enabling input operations,
   which is able to display a waveform generated based on data input through the input device or data captured from an outside source on the screen, to implement:
   a binary waveform generation function of generating a binary waveform based on prescribed data and/or a prescribed input operation through the input device;
   a third frame definition function of defining an editing area frame for editing the binary waveform generated by the binary waveform generation function; and
   an in-frame cycle modification function of modifying a binary waveform cycle in the editing area frame according to an amount of scaling of the editing area frame when a scaling operation of the editing area frame defined by the third frame definition function is detected.

7. A waveform editing program stored on computer-readable recording medium,
   the waveform editing program for allowing a waveform editing system, comprising at least a display device to display waveforms on a screen and an input device enabling input operations,
   which is able to display a waveform generated based on data input through the input device or data captured from an outside source on the screen, to implement:
   a third time-series waveform generation function of regenerating a time-series waveform from a moved point constituting the waveform and other points when a movement operation of the point is detected.

8. A waveform editing program according to claim 7, wherein:

the third time-series waveform generation function is operable to regenerate a waveform in chronological order when a time sequence of a moved point and any of other points is reversed.

9. A waveform editing program stored on computer-readable recording medium, the waveform editing program for allowing a waveform editing system, comprising at least a display device to display waveforms on a screen and an input device enabling input operations, which is able to display a waveform generated based on data input through the input device or data captured from an outside source on the screen, to implement:

a coordinate axis resolution unit selection function of enabling selections of coordinate axis resolution units; and a coordinate data acquisition function of acquiring values of coordinate data of the waveform displayed on the screen in the coordinate axis resolution units selected by the coordinate axis resolution unit selection function.

10. A waveform editing system comprising:

a computer-readable recording medium having a waveform editing program according to any of claims 1–9 stored thereon; and a waveform edit processing device operable to read the waveform editing program to perform waveform edit processing.

* * * * *